US010510810B2

(12) United States Patent
Kim et al.

(10) Patent No.: US 10,510,810 B2
(45) Date of Patent: Dec. 17, 2019

(54) DISPLAY DEVICE INCLUDING ORGANIC LAYER INCLUDING PIGMENT OR DYE AND METHOD OF MANUFACTURING THEREOF

(71) Applicant: Samsung Display Co. Ltd., Yongin-si (KR)

(72) Inventors: Su Jeong Kim, Yongin-si (KR); Yui Ku Lee, Asan-si (KR); Chul Huh, Yongin-si (KR)

(73) Assignee: SAMSUNG DISPLAY CO. LTD., Gyeonggi-Do (KR)

(*) Notice: Subject to any disclaimer, the term of this patent is extended or adjusted under 35 U.S.C. 154(b) by 14 days.

(21) Appl. No.: 15/800,213

(22) Filed: Nov. 1, 2017

(65) Prior Publication Data

US 2018/0197921 A1    Jul. 12, 2018

(30) Foreign Application Priority Data

Jan. 9, 2017    (KR) .................. 10-2017-0002876

(51) Int. Cl.
*H01L 27/32* (2006.01)
*H01L 51/52* (2006.01)
(Continued)

(52) U.S. Cl.
CPC .......... *H01L 27/322* (2013.01); *G06F 3/0412* (2013.01); *H01L 51/5246* (2013.01); *H01L 51/5253* (2013.01); *H01L 51/5284* (2013.01); *H01L 51/56* (2013.01); *G06F 3/044* (2013.01); *G06F 2203/04103* (2013.01); *G06F 2203/04111* (2013.01); *H01L 27/323* (2013.01); *H01L 27/3211* (2013.01); *H01L 27/3244* (2013.01); *H01L 2227/323* (2013.01); *H01L 2251/5369* (2013.01)

(58) Field of Classification Search
CPC ................. H01L 27/323; H01L 27/322; G06F 2203/04111; G06F 3/0412
USPC ........................................................... 257/40
See application file for complete search history.

(56) References Cited

U.S. PATENT DOCUMENTS

2009/0040433 A1\* 2/2009 Aiki .................. G02F 1/133516
349/75
2014/0175346 A1\* 6/2014 Cho ......................... G02B 1/04
252/586

(Continued)

FOREIGN PATENT DOCUMENTS

KR        100875269 B1 \* 12/2008
KR     1020100127290      12/2010
(Continued)

*Primary Examiner* — Nduka E Ojeh
(74) *Attorney, Agent, or Firm* — Cantor Colburn LLP

(57) ABSTRACT

A display device, in which a first pixel and a second pixel are defined, includes: a display panel including a base substrate and a light-emitting element disposed on the base substrate; a color filter layer disposed over the display panel and including a first color filter disposed in the first pixel and a second color filter disposed in the second pixel; and a first organic layer disposed over the display panel, and including a pigment or a dye. The first pixel displays a first color, and the second pixel displays a second color different from the first color. The organic layer is integrally formed over the first pixel and the second pixel.

20 Claims, 15 Drawing Sheets

(51) Int. Cl.
*H01L 51/56* (2006.01)
*H01L 29/08* (2006.01)
*H01L 35/24* (2006.01)
*G06F 3/044* (2006.01)
*H01L 51/00* (2006.01)
*G06F 3/041* (2006.01)

(56) References Cited

U.S. PATENT DOCUMENTS

2015/0276175 A1* 10/2015 Moriya ............. G02F 1/133621
    349/61
2017/0269732 A1* 9/2017 Chang .................... G06F 3/044
2018/0188866 A1* 7/2018 Heo ....................... G06F 3/0412

FOREIGN PATENT DOCUMENTS

KR    1020110138218    12/2011
KR    1020160114803    10/2016

\* cited by examiner

DISPLAY DEVICE INCLUDING ORGANIC LAYER INCLUDING PIGMENT OR DYE AND METHOD OF MANUFACTURING THEREOF

This application claims priority to Korean Patent Application No. 10-2017-0002876, filed on Jan. 9, 2017, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

A self-emission type display device, such as an organic light-emitting display device, may include an organic light-emitting element. The organic light-emitting element may include two electrodes facing each other and an organic light-emitting layer interposed therebetween. Electrons and holes provided from the two electrodes are recombined in the organic light-emitting layer to generate excitons, and the generated excitons are shifted from an excited state to a ground state, to emit light.

Since the organic light-emitting display device may not use an additional light source, the organic light-emitting display device is typically thin and lightweight, and has low power consumption, high quality characteristics such as a wide viewing angle, high luminance and contrast, and a rapid response speed. Thus, the organic light-emitting display device has attracted considerable attention as a next-generation display device.

SUMMARY

In an organic light-emitting display device, the electrodes and other various metal wirings thereof may reflect the light incident thereto from the outside. Therefore, when the organic light-emitting display device is used in a bright place, it may be difficult to realize a full black tone due to the reflection of external light, and the contrast thereof may be lowered.

As a method of preventing the reflection of external light, a configuration in which a polarizing element and a phase delay element are disposed on a light-emitting layer may be considered. However, when the polarizing element is disposed on the light-emitting layer, there is a limitation in that at least 50% of the light emitted from the light-emitting layer is absorbed by the polarizing element, and thus light utilization efficiency is lowered.

An embodiment of the invention is to provide a display device, which improves color purity to improve display quality, suppress the reflection of external light to improve outdoor visibility, and maximizes the utilization efficiency of light emitted by a light-emitting element to improve luminance and reduce power consumption.

Another embodiment of the invention is to provide a method of manufacturing a display device, which improves color purity to improve display quality, suppress the reflection of external light to improve outdoor visibility, and maximizes the utilization efficiency of light emitted by a light-emitting element to improve luminance and reduce power consumption.

According to an exemplary embodiment of the invention, a display device, in which a first pixel and a second pixel are defined, includes: a display panel including a base substrate and a light-emitting element disposed on the base substrate; a color filter layer disposed over the display panel, where the color filter includes a first color filter disposed in the first pixel and a second color filter disposed in the second pixel; and a first organic layer disposed over the display panel, where the first organic layer includes a pigment or a dye. In such an embodiment, the first pixel displays a first color, and the second pixel displays a second color different from the first color, and the first organic layer is integrally formed over the first pixel and the second pixel.

In an exemplary embodiment, the display panel may further include a encapsulation layer disposed on the light-emitting element, and wherein the display device may further include: a first pattern electrode disposed between the encapsulation layer and the color filter layer and extending in a first direction; and a second pattern electrode disposed between the first pattern electrode and the color filter layer, extending in a second direction intersecting the first direction, where the first organic layer may be disposed between the first pattern electrode and the second pattern electrode in a way such that the first pattern electrode and the second pattern electrode are insulated from each other by the first organic layer.

In an exemplary embodiment, the first organic layer may include an acrylic resin, an epoxy resin or a polyimide resin.

In an exemplary embodiment, the display device may further include: a second organic layer disposed between the second pattern electrode and the color filter layer, where the second organic layer may be integrally formed over the first pixel and the second pixel, the second organic layer may include a pigment or a dye, and the second organic layer may be at least partially in direct contact with the first organic layer.

In an exemplary embodiment, the first organic layer may be disposed on the color filter layer, and the display device may further include: an adhesive layer disposed on the first organic layer; and a window disposed on the adhesive layer.

In an exemplary embodiment, the display device may further include: a second organic layer disposed over the display panel, where the second organic layer may be integrally formed over the first pixel and the second pixel, and include a pigment or a dye.

In such an embodiment, a color exhibited by the pigment or dye in the first organic layer and a color exhibited by the pigment or dye in the second organic layer may be complementary to each other.

In an exemplary embodiment, the light-emitting element may include a first light-emitting element disposed in the first pixel, where the first light-emitting element emits first light having a single peak wavelength, and a second light-emitting element disposed in the second pixel, where the second light-emitting element emits second light exhibiting a different color from the first light and having a single peak wavelength.

In an exemplary embodiment, the first color filter may include a resin and a pigment dispersed in the resin, and the content of the pigment in the first color filter may be in a range of about 25 weight percent (wt %) to about 30 wt % based on the total weight of the first color filter.

In an exemplary embodiment, the first color filter may have a regular taper shape.

In an exemplary embodiment, the first color filter may further include a silicon-based compound or a fluorine-based compound.

In an exemplary embodiment, the pigment in the first organic layer may exist in the form of particles, and the pigment in the first organic layer may include a black pigment or a plurality of pigments exhibiting different colors from each other.

In an exemplary embodiment, an average particle size of the pigment in the first organic layer may be in a range of about 50 nanometers (nm) to about 200 nm.

In an exemplary embodiment, the display device may further include: a window disposed on the first organic layer and the color filter layer, where an amount of external light passed through the window and reaching the display panel may be in a range of about 50% to about 70% of the total amount of the external light.

In an exemplary embodiment, the light-emitting element may include a first light-emitting element disposed in the first pixel, where the first light-emitting element emits first light having a single peak wavelength, and a second light-emitting element disposed in the second pixel, where the second light-emitting element emits second light having a single peak wavelength less than the peak wavelength of the first light. In such an embodiment, a ratio of an amount of the first light emitted from the first light-emitting element and passing through the window to an amount of the first light emitted from the first light-emitting element may be less than an ratio of an amount of the second light emitted from the second light-emitting element and passing through the window to an amount of the second light emitted from the second light-emitting element.

In an exemplary embodiment, the display device may further include: a window disposed on the first organic layer and the color filter layer, where the external light passed through the window and traveling toward the light-emitting element may be in an unpolarized state.

According to another exemplary embodiment of the invention, a method of manufacturing a display device, in which a first pixel and a second pixel are defined, includes: preparing a display panel including a base substrate, light-emitting elements disposed over the base substrate and disposed on the first pixel and the second pixel, and an encapsulation layer disposed on the light-emitting elements; and providing an organic layer including a pigment or a dye on the encapsulation layer. In such an embodiment, the first pixel displays a first color, and the second pixel displays a second color different from the first color, and the organic layer is integrally formed over the first pixel and the second pixel.

In an exemplary embodiment, the method may further include: providing a patterned color filter on the organic layer after the providing the organic layer.

In an exemplary embodiment, the providing the patterned color filter may include: applying a color filter composition including the pigment and a curable monomer onto the organic layer; exposing and developing the color filter composition to form a patterned pre-color filter; and baking the patterned pre-color filter at a temperature of about 120° C. or lower, where the content of the pigment in the color filter composition may be in a range of about 5 wt % to about 6 wt % based on the total weight of the color filter composition.

In an exemplary embodiment, the light-emitting element may include a first light-emitting element disposed in the first pixel and emitting first light having a single peak wavelength, and a second light-emitting element disposed in the second pixel and emitting second light exhibiting a different color from the first light and having a single peak wavelength, and the patterned color filter may be disposed in the first pixel.

In an exemplary embodiment, the method may further include: providing a patterned color filter on the encapsulation layer after the preparing the display panel and before the providing the organic layer, where the organic layer may be at least partially in direct contact with the patterned color filter.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
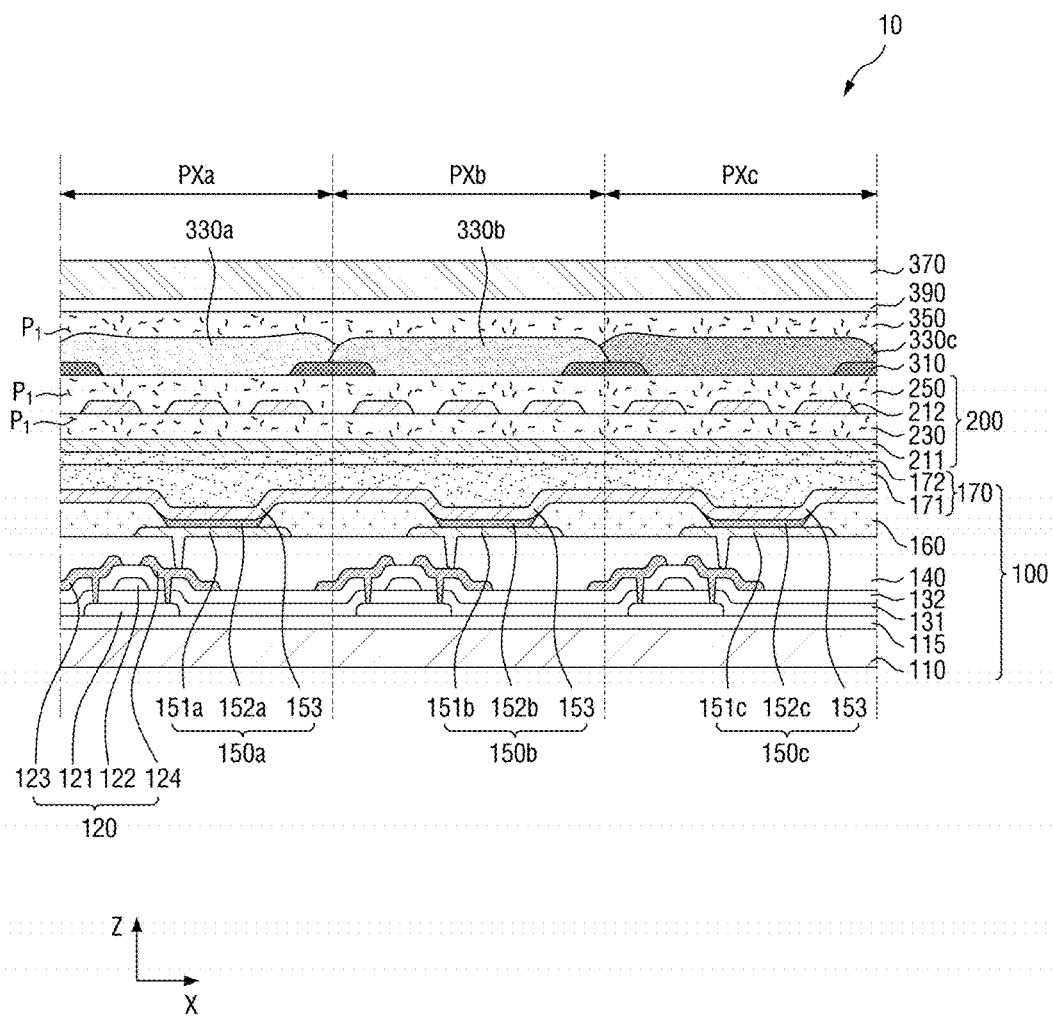
FIG. 1 is a cross-sectional view of a display device according to an embodiment of the invention.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof "At least one" is not to be construed as limiting "a" or "an." "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In this specification, a first direction X means any one direction in a plane, a second direction Y means a direction intersecting the first direction X in the plane, and a third direction Z means a direction perpendicular to the first and second directions X and Y or the plane.

Hereinafter, embodiments of the invention will be described with reference to the accompanying drawings.

Figure 2:
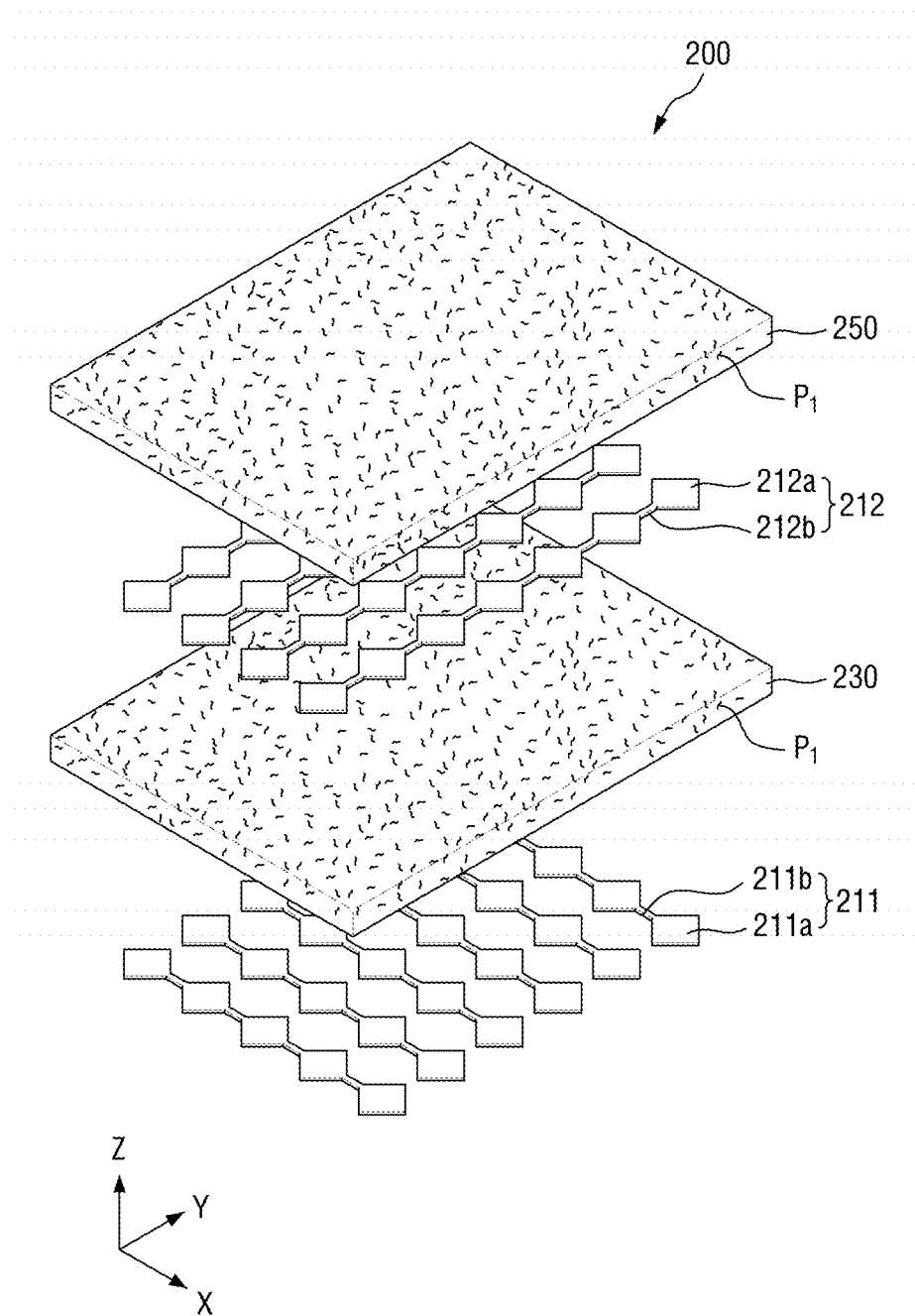
FIG. 2 is an exploded perspective view of an embodiment of the touch unit of FIG. 1.

FIG. 1 is a cross-sectional view of a display device according to an embodiment of the invention. FIG. 2 is an exploded perspective view of an embodiment of the touch unit of FIG. 1.

Referring to FIGS. 1 and 2, an embodiment of a display device 10 may include a display panel 100 and a touch unit 200.

The display device 10 includes a plurality of pixels. Each of the pixels may display one of primary colors to implement the color display. The plurality of pixels include a first pixel PXa for displaying a first color, a second pixel PXb for displaying a second color having a shorter wavelength than the first color, and a third pixel PXc for displaying a third color having a shorter wavelength than the second color. In an exemplary embodiment, the first pixel PXa is a red pixel for displaying a red color, the second pixel PXb is a green pixel for displaying a green color, and the third pixel PXc is a blue pixel for displaying a blue color. The first pixel PXa, the second pixel PXb, and the third pixel PXc may be arranged in a planar matrix form while constituting a pixel unit for color display. Hereinafter, the components of the display panel 100 will be described in detail.

The display panel 100 includes a base substrate 110, one or more light-emitting elements (e.g., light-emitting devices) 150a, 150b and 150c disposed on a surface (e.g., an upper surface) of the base substrate 110, a thin film transistor 120 providing driving signals for driving the light-emitting elements 150a, 150b and 150c, and an encapsulation layer 170 disposed to cover or seal the light-emitting elements 150a, 150b and 150c.

The base substrate 110 may be a transparent or opaque insulating substrate. In some embodiments, the base substrate 110 may have flexibility. In one embodiment, for example, the base substrate 110 may be a glass film or a plastic film such as a polyimide film, a polycarbonate film, a polyethersulfone film, a polyethylene terephthalate film, or a polyacrylate film.

A barrier layer 115 may be disposed on the base substrate 110. The barrier layer 115 may effectively prevent the penetration of impurities or moisture. The barrier layer 115 may include or be made of silicon nitride ($SiN_x$), silicon oxide ($SiO_x$), silicon nitroxide ($SiN_xO_y$), or silicon oxynitride ($SiO_xN_y$).

At least one thin film transistor 120 may be disposed on the barrier layer 115. The thin film transistor 120 may include a gate electrode 122 that functions as a control terminal, a source electrode 123 that functions as an input terminal, a drain electrode 124 that functions as an output terminal, and an active layer 121 in which a channel is formed. The thin film transistor 120 may provide a current or voltage for driving the light-emitting element in a specific pixel.

The active layer 121 may be disposed on the barrier layer 115. The active layer 121 may include a semiconductor material. In one embodiment, for example, the active layer 121 may include polycrystalline silicon or the like. However, the invention is not limited thereto. In an alternative embodiment, the active layer may include monocrystalline silicon or amorphous silicon, or may include or be made of an oxide semiconductor or a semiconductor other than silicon.

The gate electrode 122 may be disposed on the active layer 121. The gate electrode 122 may be disposed to overlap a channel region of the active layer 121. The gate electrode 122 may be electrically connected with the output terminal of a switching element (not shown) that controls the on/off operation of a specific pixel. The gate electrode 122 may include or be made of aluminum (Al), molybdenum (Mo), copper (Cu), or an alloy thereof. The gate electrode 122 may have a single layer structure or a multi-layer structure.

A first insulating layer 131 is interposed between the active layer 121 and the gate electrode 122 to insulate the active layer 121 and the gate electrode 122 from each other. The first insulating layer 131 may include or be made of an inorganic insulating material such as silicon nitride, silicon oxide, silicon nitroxide, or silicon oxynitride.

In such an embodiment, a second insulating layer 132 may be disposed on the gate electrode 122. The second insulating layer 132 may include or be made of an inorganic insulating material such as silicon nitride, silicon oxide, silicon nitroxide, or silicon oxynitride, or an organic insulating material such as an acrylate resin or a polyimide resin. The second insulating layer 132 may have a single layer structure or a multi-layer structure. Contact hole are defined or formed in the first insulating layer 131 and the second insulating layer 132 to expose at least a part of the active layer 121.

The source electrode 123 and the drain electrode 124 may be disposed on the second insulating layer 132. The source electrode 123 may be disposed to overlap the source region of the active layer 121, and the drain electrode 124 may be disposed to overlap the drain region of the active layer 121. The source electrode 123 and the drain electrode 124 may be electrically connected to the active layer 121 through the contact holes defined in the first insulating layer 131 and the second insulating layer 132, respectively. The source electrode 123 may be electrically connected to a driving voltage line (not shown), and the drain electrode 124 may be electrically connected to a pixel electrode.

A planarization layer 140 may be disposed on the source electrode 123 and the drain electrode 124. The planarization layer 140 may protect the source electrode 123, the drain electrode 124 and the like, and may have a flat upper surface to planarize the components disposed therebelow and stacked on the base substrate 110. The planarization layer 140 may include an organic material. In one embodiment, for example, the planarization layer 140 may include an organic material, such as an acrylic resin, an epoxy resin, a polyimide resin or a polyester resin.

The plurality of light-emitting elements 150a, 150b and 150c may be disposed on the planarization layer 140. The light-emitting elements 150a, 150b and 150c may be organic light-emitting elements. The organic light-emitting elements include a first light-emitting element 150a disposed in the first pixel PXa, a second light-emitting element 150b disposed in the second pixel PXb, and a third light-emitting element 150c disposed in the third pixel PXc. The first light-emitting element 150a, the second light-emitting element 150b and the third light-emitting element 150c may emit light having different colors from each other.

The first light-emitting element 150a includes a first pixel electrode 151a, a common electrode 153 disposed on the first pixel electrode 151a, and a first organic light-emitting layer 152a interposed between the first pixel electrode 151a and the common electrode 153. The first pixel electrode 151a may be an anode electrode, and the common electrode 153 may be a cathode electrode. The first pixel electrode 151a may be electrically connected with the drain electrode 124 of the thin film transistor 120 through a contact hole defined in the planarization layer 140.

The anode electrode may include a conductive material having a relatively larger work function than the cathode electrode. The first pixel electrode 151a may be a transparent electrode, an opaque electrode, or a laminated structure of a transparent electrode and an opaque electrode. In one embodiment, for example, the material of the transparent electrode may be indium tin oxide ("ITO"), indium zinc oxide ("IZO"), zinc oxide or indium oxide, and the material of the opaque electrode may be Li, Al, Mg, Ag, Ni, or Cr. The first pixel electrode 151a may be disposed in each of predetermined pixels, e.g., each of the first pixels PXa.

The cathode electrode may include a conductive material having a relatively smaller work function than the anode electrode. The common electrode 153 may drive the light-emitting element together with the pixel electrodes that facing the common electrode 153. The common electrode 153 may be a transparent electrode, an opaque electrode, or a laminated structure of a transparent electrode and an opaque electrode. The common electrode 153 may be disposed substantially on the entire surface of the display panel 100 without distinguishing the pixels. In an embodiment, the common electrode 153 may be integrally formed in the first pixel PXa, the second pixel PXb, and the third pixel PXc as a single unitary and indivisible unit.

The first organic light-emitting layer 152a may be interposed between the first pixel electrode 151a and the common electrode 153. The first organic light-emitting layer 152a may recombine holes and electrons transferred from the first pixel electrode 151a and the common electrode 153 to generate light. When holes and electrons are provided to the first organic light-emitting layer 152a, the holes and electrons are recombined to form excitons, and the excitons may emit light while shifting from the excited state to the ground state. In an exemplary embodiment, the first organic light-emitting layer 152a may be an organic light-emitting layer that emits red light. In one embodiment, for example, the first organic light-emitting layer 152a may emit light having a single peak wavelength located within a wavelength range of about 610 nanometers (nm) to about 650 nm. About 80% or more of the light emitted by the first organic light-emitting layer 152a may be included in the range of about 610 nm to about 650 nm.

Although not shown in the drawings, in some embodiments, The first light-emitting element 150a may further include a functional layer, such as a hole injection layer ("HIL"), a hole transport layer ("HTL"), an electron injection layer ("EIL") or an electron transfer layer ("ETL"), which is interposed between the first pixel electrode 151a and the common electrode 153.

The second light-emitting element 150b may include a second pixel electrode 151b, a common electrode 153 disposed on the second pixel electrode 151b, and a second organic light-emitting layer 152b interposed between the second pixel electrode 151b and the common electrode 153. The third light-emitting element 150c may include a third pixel electrode 151c, a common electrode 153 disposed on the third pixel electrode 151c, and a third organic light-emitting layer 152c interposed between the third pixel electrode 151c and the common electrode 153. In an embodiment, as shown in FIG. 1, the second pixel electrode 151b and the third pixel electrode 151c may be electrically connected to corresponding thin film transistors through the contact holes defined in the planarization layer 140, respectively.

The second pixel electrode 151b and the third pixel electrode 151c may include or be made of substantially the same material as the first pixel electrode 151a. The second pixel electrode 151b and the third pixel electrode 151c may be disposed in predetermined pixels, respectively. In an embodiment, the second pixel electrode 151b may be disposed in each of the second pixels PXb, and the third pixel electrode 151c may be disposed in each of the third pixel PXc.

The second organic light-emitting layer 152b may be interposed between the second pixel electrode 151b and the common electrode 153. The second organic light-emitting layer 152b may recombine holes and electrons transferred from the second pixel electrode 151b and the common electrode 153 to generate light. In an exemplary embodiment, the second organic light-emitting layer 152b may be an organic light-emitting layer that emits green light. In one embodiment, for example, the second organic light-emitting layer 152b may emit light having a single peak wavelength located within a wavelength range of about 530 nm to about 570 nm. About 80% or more of the light emitted by the second organic light-emitting layer 152b may be included in the range of about 530 nm to about 570 nm.

The third organic light-emitting layer 152c may be interposed between the third pixel electrode 151c and the common electrode 153. The third organic light-emitting layer 152c may recombine holes and electrons transferred from the third pixel electrode 151c and the common electrode 153 to generate light. In an exemplary embodiment, the third organic light-emitting layer 152c may be an organic light-emitting layer that emits blue light. In one embodiment, for example, the third organic light-emitting layer 152c may emit light having a single peak wavelength located within a wavelength range of about 430 nm to about 470 nm. About 80% or more of the light emitted by the third organic light-emitting layer 152c may be included in the range of about 430 nm to about 470 nm.

In an alternative embodiment, all of the first light-emitting element 150a, the second light-emitting element 150b and the third light-emitting element 150c may emit light having a same color as each other. In one embodiment, for example, the first light-emitting element 150a, the second light-emitting element 150b and the third light-emitting element 150c may be organic light-emitting elements that emit white light.

A pixel defining layer 160 may be disposed on the first pixel electrode 151a, the second pixel electrode 151b and the third pixel electrode 151c. The pixel defining layer 160 may serve to separate the respective pixels PXa, PXb and PXc, or define each pixel area. The pixel defining layer 160 may be disposed to expose at least a part of the first pixel electrode 151a, the second pixel electrode 151b and the third pixel electrode 151c.

In such an embodiment, when from a plan view (e.g., a top plan view or a plan view in the thickness direction of the base substrate 110), openings exposing the respective pixel electrodes 151a, 151b and 151c be defined through the pixel defining layer 160. The first organic light-emitting layer 152a, the second organic light-emitting layer 152b and the third organic light-emitting layer 152c are located in the openings, respectively, and the common electrode 153 may be disposed on the pixel defining layer 160, and may be integrally formed as a single unitary and indivisible unit over the pixels. The pixel defining layer 160 may include an organic material such as a polyacrylic resin or a polyimide resin.

An encapsulation layer 170 may be disposed over the pixel defining layer 160. The encapsulation layer 170 may be disposed on the light-emitting elements 150a, 150b, and 150c to seal the light-emitting elements 150a, 150b, and 150c to prevent impurities or moisture from penetrating therethrough from an outside of the display panel 100. The encapsulation layer 170 may include a first encapsulation layer 171 and a second encapsulation layer 172. The first encapsulation layer 171 may include an organic material such as an acrylic resin or an epoxy resin, and the second encapsulation layer 172 may include an inorganic material such as silicon nitride, silicon oxide, silicon nitroxide, or silicon oxynitride. In an embodiment, as shown in FIG. 1, the encapsulation layer 170 has a two-layer structure in which the first encapsulation layer 171 including an organic material and the second encapsulation layer 172 including an inorganic material are laminated, but not being limited thereto. In an alternative embodiment, the encapsulation layer 170 may have a single layer structure, or may have a multi-layer structure with three or more layers. In an embodiment, where the encapsulation layer 170 has a single layer structure, the encapsulation layer 170 may include an inorganic material. In another alternative embodiment, the encapsulation layer 170 may include an encapsulation substrate.

The touch unit 200 may be disposed on the encapsulation layer 170. The touch unit may sense a touch by a part of a user's body or a stylus pen. The touch unit 200 may include a first pattern electrode 211, a second pattern electrode 212 disposed over the first pattern electrode 211 to be insulated from the first pattern electrode 211, a third insulating layer 230 interposed between the first pattern electrode 211 and the second pattern electrode 212, and a fourth insulating layer 250 disposed on the second pattern electrode 212.

The first pattern electrode 211 may extend in a first direction X and may be spaced in a second direction Y, and the first pattern electrode 211 may be provided in plural. The first pattern electrode 211 may be a touch electrode that transmits the sensed touch signal in the first direction X. The first pattern electrode 211 may include an extension portion 211a having a predetermined area and a connecting portion 211b connecting the extension portions 211a to each other. The extension portion 211a is a portion having a width wider than a width of the connecting portion 211b. The planar shape of the extension portion 211a may be a rhombic shape, but is not limited thereto, and alternatively, may be a circle or a polygonal shape such as a rectangle. In some embodiments, the first pattern electrode 211 may be formed on the encapsulation layer 170 by direct deposition and patterning.

The second pattern electrode 212 may be disposed over the first pattern electrode 211. The second pattern electrode 212 may extend in the second direction Y and may be spaced in the first direction X, and second pattern electrode 212 may be provided in plural. The second pattern electrode 212 may be a touch electrode that transmits the sensed touch signal in the second direction Y. The second pattern electrode 212 may include an extension portion 212a having a predetermined area and a connecting portion 212b connecting the extension portions 212a to each other. In some embodiments, the second pattern electrode 212 may be formed on the third insulating layer 230 by direct deposition and patterning.

The third insulating layer 230 may insulate the first pattern electrode 211 and the second pattern electrode 212 from each other. The third insulating layer 230 may be an organic insulating layer including an organic material, such as an acrylic resin, an epoxy resin or a polyimide resin. The third insulating layer 230 may be integrally formed over the plurality of pixels PXa, PXb and PXc as a single unitary and indivisible unit. In one embodiment, for example, the third insulating layer 230 may be formed over the entire surface of the base substrate 110 to cover the entire pixels PXa, PXb and PXc.

The fourth insulating layer 250 may be disposed on the second pattern electrode 212 to insulate the second pattern electrode 212 and the components disposed on the fourth insulating layer 250 from each other. The fourth insulating layer 250 may have a flat surface to planarize the upper portion of the second pattern electrode 212. At least a portion of the fourth insulating layer 250 may be in direct contact with the third insulating layer 230. The fourth insulating layer 250 may be an organic insulating layer including an organic material, such as an acrylic resin, an epoxy resin or a polyimide resin. The fourth insulating layer 250 may be integrally formed over the plurality of pixels PXa, PXb and PXc as a single unitary and indivisible unit. In one embodiment, for example, the fourth insulating layer 250 may be formed over the entire surface of the base substrate 110 to cover the entire pixels PXa, PXb, and PXc.

The third insulating layer 230 and the fourth insulating layer 250 will be described in detail later together with an overcoat layer 350.

A light-blocking member 310 may be disposed on the fourth insulating layer 250. The light-blocking member 310 may absorb or reflect at least a part of incident light to prevent light from being transmitted therethrough. The light-blocking member 310 may be, for example, a black matrix.

The light-blocking member 310 may have a planar lattice shape. The light-blocking member 310 is disposed at a boundary between the pixels PXa, PXb and PXc, and may suppress the color mixing defect of red light emitted from the first light-emitting element 150a, green light emitted from the second light-emitting element 150b and blue light emitted from the third light-emitting element 150c.

Color filter layer 330a, 330b and 330c may be disposed on the light-blocking member 310 and the fourth insulating layer 250. The color filter layer 330a, 330b and 330c includes a first color filter 330a disposed in the first pixel PXa, a second color filter 330b disposed in the second pixel PXb, and a third color filter 330c disposed in the third pixel PXc.

The first color filter 330a selectively transmits only a specific wavelength band of light. The first color filter 330a may selectively transmit light of substantially the same color as the light emitted by the first light-emitting element 150a. In one embodiment, for example, when the first light-emitting element 150a emits a red light, the first color filter 330a may selectively transmit only an intrinsic wavelength of the red light and absorb the remaining wavelength band of the red light.

The first color filter 330a may include an acrylic resin and/or an epoxy resin and a red pigment dispersed in the resin. The content of the red pigment in the first color filter 330a may be in the range of about 25 weight percent (wt %) to about 30 wt % based on the total weight of the first color filter 330a. When the content of the red pigment is about 25 wt % or more, the first color filter 330a may have sufficient transmission selectivity for light of a specific wavelength band. When the content of the red pigment is about 30 wt % or less, the curing of the color filter may be easily performed even though a baking process is performed at a relatively low temperature as in a manufacturing method to be described later, so that processability may be improved, and a first color filter 330a having a regular taper shape may be realized. In one embodiment, for example, the first color filter 330a may not substantially include a black pigment and a gray pigment.

In an embodiment, the first color filter 330a may have a regular taper shape. In such an embodiment, the planar area of the surface of the first color filter 330a facing the display panel 100 (that is, the lower surface in the drawing) may be larger than that of the surface of the first color filter 330a facing a window 370 (that is, the upper surface in the drawing), and the sidewalls of the first color filter 330a may have an inclination. Accordingly, an air layer or the like may be effectively prevented from being trapped between the first color filter 330a and the component thereunder, for example, the light-blocking member 310 or the fourth insulating layer 250.

The second color filter 330b selectively transmits only a specific wavelength band of light. The second color filter 330b may selectively transmit light of substantially the same color as the light emitted by the second light-emitting element 150b. In one embodiment, for example, when the second light-emitting element 150b emits a green light, the second color filter 330b may selectively transmit only an intrinsic wavelength of the green light and absorb the remaining wavelength band of the green light.

The second color filter 330b may include an acrylic resin and/or an epoxy resin and a green pigment dispersed in the resin. The content of the green pigment in the second color filter 330b may be in the range of about 25 wt % to about 30 wt % based on the total weight of the second color filter 330b. When the content of the red pigment is about 25 wt % or more, the second color filter 330b may have sufficient transmission selectivity for light of a specific wavelength band. When the content of the green pigment is about 30 wt % or less, processability may be improved, and a second color filter 330b having a regular taper shape may be realized. In one embodiment, for example, the second color filter 330b may not substantially include a black pigment and a gray pigment.

The second color filter 330b may have a regular taper shape. In such an embodiment, the planar area of the lower surface of the second color filter 330b facing the display panel 100 may be larger than that of the upper surface of the second color filter 330b facing the window 370, and the sidewalls of the second color filter 330b may have an inclination.

The third color filter 330c selectively transmits only a specific wavelength band of light. The third color filter 330c may selectively transmit light of substantially the same color as the light emitted by the third light-emitting element 150c. In one embodiment, for example, when the third light-emitting element 150c emits a blue light, the third color filter 330c may selectively transmit only an intrinsic wavelength of the blue light and absorb the remaining wavelength band of the blue light.

The third color filter 330c may include an acrylic resin and/or an epoxy resin and a blue pigment dispersed in the resin. The content of the blue pigment in the third color filter 330c may be in the range of about 25 wt % to 30 wt % based on the total weight of the third color filter 330c. When the content of the blue pigment is about 25 wt % or more, the third color filter 330c may have sufficient transmission selectivity for light of a specific wavelength band. When the content of the blue pigment is about 30 wt % or less, processability may be improved, and a third color filter 330c having a regular taper shape may be realized. In one embodiment, for example, the third color filter 330c may not substantially include a black pigment and a gray pigment.

The third color filter 330c may have a regular taper shape. That is, the planar area of the lower surface of the third color filter 330c facing the display panel 100 may be larger than that of the upper surface of the third color filter 330c facing the window 370, and the sidewalls of the third color filter 330c may have an inclination.

The first color filter 330a, the second color filter 330b and the third color filter 330c may improve the color purity of the light emitted by the light-emitting elements 150a, 150b and 150c, may absorb at least a part of the wavelength band of the external light passing through the color filters (e.g., the color filter layer), and may absorb at least a part of the wavelength band of the reflected light reflected by the electrode in the display panel 100, to suppress the reflection due to the external light. In some embodiments, the first color filter 330a, the second color filter 330b and/or the third color filter 330c may further include a silicon-based compound and/or a fluorine-based compound.

An overcoat layer 350 may be disposed on the color filter layer 330a, 330b and 330c. The overcoat layer 350 may be in direct contact with the color filter layer 330a, 330b and 330c. The overcoat layer 350 may be an organic layer including an organic material such as an acrylic resin, an epoxy resin, or a polyimide resin. The method of forming the overcoat layer 350 is not particularly limited, but may be performed, for example, through a coating process. The overcoat layer 350 may be integrally formed over the plurality of pixels PXa, PXb and PXc as a single unitary and indivisible unit. In one embodiment, for example, the overcoat layer 350 may be formed over the entire surface of the base substrate 110 to cover the entire pixels PXa, PXb and PXc.

At least one of the third insulating layer 230, the fourth insulating layer 250 and the overcoat layer 350 may include at least one of a pigment $P_1$ and a dye (not shown) dispersed in the organic material forming each of the layers. FIG. 1 illustrates an embodiment where all of the third insulating layer 230, the fourth insulating layer 250 and the overcoat layer 350 include the pigment $P_1$, but not being limited thereto. Alternatively, the pigments in some of the third insulating layer 230, the fourth insulating layer 250 and the overcoat layer 350 may be omitted. The pigment $P_1$ absorbs at least a part of the light passing through the third insulating layer 230, the fourth insulating layer 250 or the overcoat layer 350, thereby reducing the light transmittance of each of the layers. In one embodiment, for example, the pigment $P_1$ may be a black pigment such as carbon black, or may be a gray pigment.

In an exemplary embodiment, the pigment in the third insulating layer 230, the pigment in the fourth insulating layer 250 and the pigment in the overcoat layer 350 may be only a black pigment and/or a gray pigment.

In an embodiment, where the pigment $P_1$ exists in the form of particles, the average particle size of the pigment $P_1$ is not particularly limited. In one embodiment, for example, the pigment $P_1$ may have an average particle size of, for example, about 50 nm to 200 nm. When the average particle size of the pigment $P_1$ is about 50 nm or more, the pigment $P_1$ may have a sufficient degree of light absorbing characteristics. When the average particle size of the pigment $P_1$ is about 200 nm or less, the pigment $P_1$ may have high dispersion characteristics in an organic material without causing color mixing defects due to light scattering.

A window 370 may be disposed over the overcoat layer 350 with an adhesive layer 390 interposed therebetween. The window 370 may be a window glass disposed on the entire front surface of the display device 10 to protect the display panel 100 and the like and form a display surface on which an image is viewed. The window 370 may include or be made of a material having high transmittance and high durability. In an embodiment, the window 370 may be a multi-layer structure in which a plurality of layers is stacked. The adhesive layer may be in direct contact with the overcoat layer 350 and the window 370 to attach the overcoat layer 350 and the window 370. In an exemplary embodiment, the adhesive layer 390 may include or be made of a pressure-sensitive adhesive, but the invention is not limited thereto.

Figure 3:
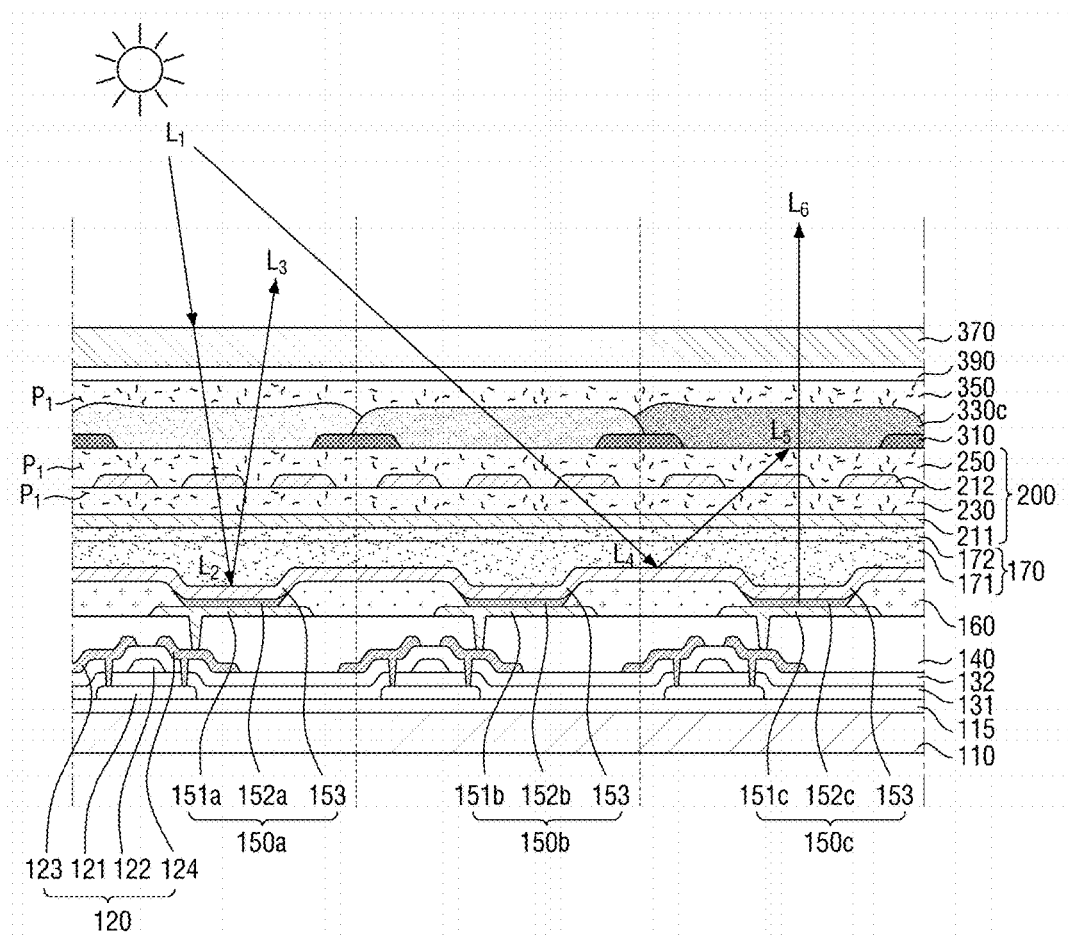
FIG. 3 is a cross-sectional view showing the principle of suppressing the reflection of external light by the display device of FIG. 1.

Hereinafter, the principle of suppressing the reflection of external light by the display device 10 according to an embodiment will be described in detail with reference to FIG. 3. FIG. 3 is a cross-sectional view showing the principle of suppressing the reflection of external light by the display device of FIG. 1.

Referring to FIGS. 1 to 3, at least a part of the light $L_1$ emitted by an external light source located above the window 370 passes through the window 370 and travels toward the display panel 100 (e.g., light $L_2$), and the reflected light $L_3$ reflected by the electrodes and the like in the display panel 100 passes through the window 370 again, and the reflected light $L_3$ may be viewed by a viewer through the window 370. FIG. 3 illustrates a case in which external light is reflected by the common electrode 153. However, the invention is not limited thereto, and the reflection of external light may be caused by the electrodes in the display panel 100, wirings, organic layers, and/or interfaces of each of the layers.

In an exemplary embodiment, the amount of external light $L_2$ and $L_4$ passed through the window 370 and reaching the display panel 100 may be about 50% to 70% of the total amount of the light $L_1$ emitted from the external light source. That is, the light absorption rate of the window 370 and the touch unit 200 may be about 30% to 50%.

The amount of the light $L_3$ reflected by the display panel 100 and viewed by the viewer is about 50% to 70% of the amount of the light $L_2$ passed through the window 370 from the external light source and reaching the display panel 100. A predetermined light transmittance reduction may be achieved by interposing at least one organic layer dispersed with a black pigment or a gray pigment between the viewer and the display panel 100 where the main reflection to the external light $L_1$ is conducted, thereby suppressing the reflection of external light.

At least a part of the light $L_1$ emitted by an external light source passes through the window 370 and travels toward the display panel 100 (e.g., light $L_4$), and the reflected light $L_5$ reflected by the electrodes and the like in the display panel 100 may be blocked by the color filter layer 330a, 330b and 330c. In one embodiment, for example, the external light $L_1$ exhibiting a white color may pass through the second color filter 330b to allow only the green light $L_4$ to reach the display panel 100, and the green light reflected by the display panel 100 may be absorbed by the third color filter 330c that selectively transmits only the blue intrinsic wavelength to allow the green light not to pass through the third color filter 330c. Thereby, the reflection of external light may be suppressed.

In such an embodiment, the light $L_6$ emitted by a light-emitting device, for example, the third light-emitting element 150c, may pass through the third color filter 330c and the window 370 to contribute to image display.

The ratio of the amount of red light contributing to image display to the total amount of red light emitted from the first light-emitting element 150a may be less than the ratio of the amount of green light contributing to image display to the total amount of green light emitted from the second light-emitting element 150b. Further, the ratio of the amount of green light contributing to image display to the total amount of green light emitted from the second light-emitting element 150b may be less than the ratio of the amount of blue light contributing to image display to the total amount of blue light emitted from the third light-emitting element 150c.

In an embodiment, as described above, the display device 10 including the color filter layer 330a, 330b and 330c and the pigment $P_1$ has an effect of enhancing luminance as well as a function of suppressing the reflection of external light without including an additional polarizing element conventionally provided between the display panel 100 and the window 370 to suppress the reflection of external light. In such an embodiment, not only the color filter layer 330a, 330b and 330c but also one or more organic layers 230, 250 and 350 contribute to suppressing the reflection of external light, thereby relatively reducing the content of the pigment in the color filter, and thus color filters having a regular taper shape may be easily formed.

In an embodiment, the external light $L_2$ and $L_4$ passed through the window 370 and traveling toward the display panel 100, for example, the external light $L_2$ and $L_4$ passed through the window 370 and traveling toward the light-emitting element, may be light in a substantially unpolarized state. Here, the light in the unpolarized state means light in a state in which the light is not composed of only a polarized component vibrating in a specific direction, that is, light in a state in which the light includes linearly polarized components or circularly polarized components vibrating in various directions. Therefore, the light contributing to image display may maintain the unpolarized state and have an effect of improving the display quality of the display device 10 without providing an additional layer having a polarization canceling function in front of the display device 10.

Hereinafter, alternative embodiments of the invention will be described. However, a description of substantially the same configuration as the embodiment according to FIG. 1 and the like will be omitted, which will be apparent to those skilled in the art from the accompanying drawings.

Figure 4:
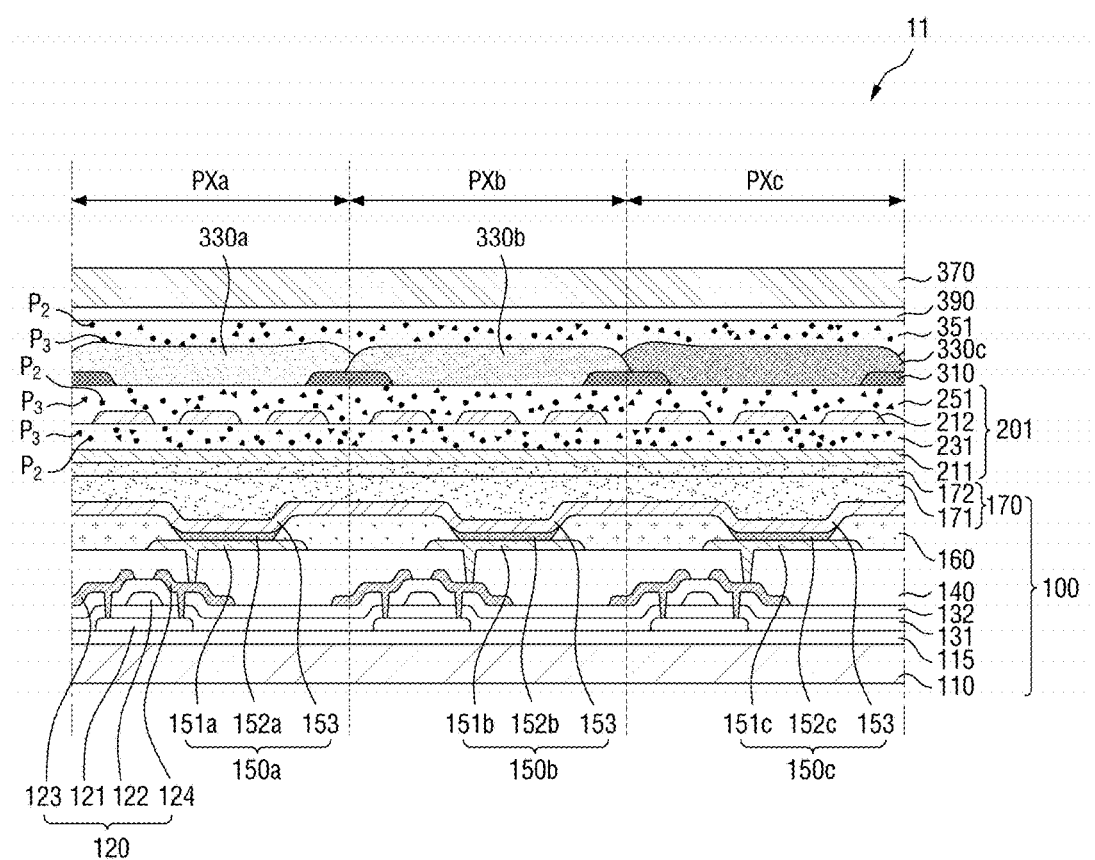
FIG. 4 is a cross-sectional view of a display device according to an alternative embodiment of the invention.

FIG. 4 is a cross-sectional view of a display device according to an alternative embodiment of the invention.

The display device 11 shown in FIG. 4 is substantially the same as the display device 10 shown in FIG. 1 except that at least one of the third insulating layer 231, fourth insulating layer 251 of a touch unit 201 and overcoat layer 351 of the display device 11 may include at least one of a pigment and a dye dispersed in the organic material forming each of the layers, and the pigment in each of the layers include a plurality of pigments $P_2$ and $P_3$ or dyes exhibiting different colors from each other.

In one embodiment, for example, the third insulating layer 231 may include a second pigment $P_2$ and a third pigment $P_3$ that exhibit different colors from each other. In an exemplary embodiment, the color exhibited by the second pigment $P_2$ and the color exhibited by the third pigment $P_3$ may be substantially complementary to each other. In such an embodiment, the pigment in the third insulating layer 231 may be composed of only the second pigment $P_2$ and the third pigment $P_3$. In one embodiment, for example, the second pigment $P_2$ may be a green pigment and the third pigment $P_3$ may be a magenta pigment, the second pigment $P_2$ may be a blue pigment and the third pigment $P_3$ may be a yellow pigment, or the second pigment $P_2$ may be a red pigment and the third pigment $P_3$ may be a cyan pigment. The second pigment $P_2$ and the third pigment $P_3$ may be mixed with each other to reduce transmittance without substantially changing the color of the transmitted light.

In such an embodiment, the fourth insulating layer 251 and the overcoat layer 351 may v the second pigment $P_2$ and the third pigment $P_3$, which exhibit different colors from each other. In an exemplary embodiment, the color exhibited by the second pigment $P_2$ and the color exhibited by the third pigment $P_3$ may be complementary to each other.

In another alternative embodiment, one or two layers of the third insulating layer 231, the fourth insulating layer 251 and the overcoat layer 351 may not substantially include a pigment or a dye. In such an embodiment, at least one of the third insulating layer 231, the fourth insulating layer 251 and the overcoat layer 351 may include a black pigment or gray pigment.

Figure 5:
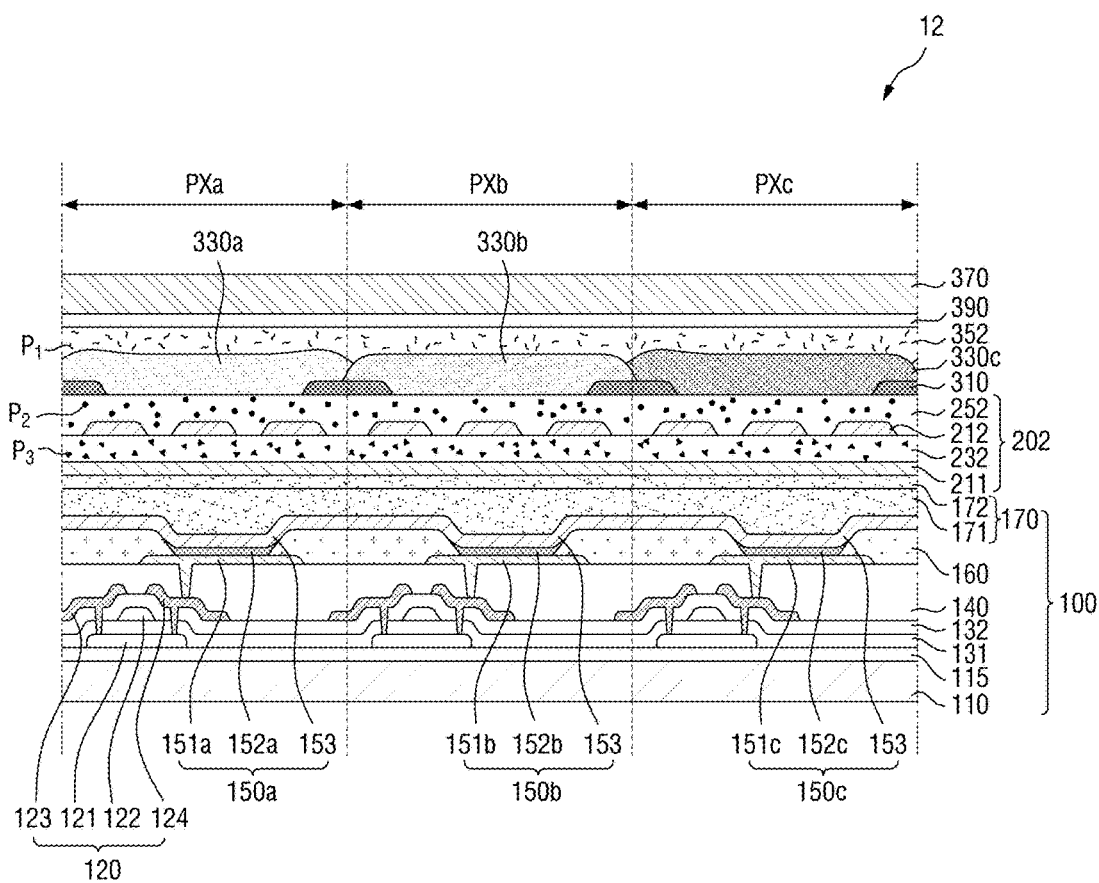
FIGS. 5 and 6 are cross-sectional views of display devices according to other alternative embodiments.

FIG. 5 is a cross-sectional view of a display device according to another alternative embodiment of the invention.

The display device 12 shown in FIG. 5 is substantially the same as the display device 10 shown in FIG. 1 except that the third insulating layer 232, fourth insulating layer 252 of a touch unit 202 and overcoat layer 352 of the display device 12 include pigments $P_1$, $P_2$ and $P_3$ or dyes, respectively.

In one embodiment, for example, the overcoat layer 352 may include a first pigment $P_1$, the fourth insulating layer 252 may include a second pigment $P_2$, and the third insulating layer 232 may include a third pigment $P_3$. The first pigment $P_1$, the second pigment $P_2$ and the third pigment $P_3$ may be pigments or dyes exhibiting different colors from each other. In an exemplary embodiment, the first pigment $P_1$ is a black pigment or a gray pigment, and the pigment in the overcoat layer 352 is composed of only the first pigment $P_1$; and the color exhibited by the second pigment $P_2$ and the color exhibited by the third pigment $P_3$ are complementary to each other, the pigment in the fourth insulating layer 252 may be composed of only the second pigment $P_2$, and the pigment in the third insulating layer 232 may be composed of only the third pigment $P_3$. The colors exhibited by the second pigment $P_2$ and the third pigment $P_3$ have been described as above together with the embodiment of FIG. 4.

In another alternative embodiment, the types of pigment included in the third insulating layer 232, the fourth insulating layer 252 and the overcoat layer 352 may be variously modified, that is, the overcoat layer 352 may include one of the first to third pigments $P_1$, $P_2$ and $P_3$, the fourth insulating layer 252 may include another of the first to third pigments $P_1$, $P_2$ and $P_3$, and the third insulating layer 232 may include the other of the first to third pigments $P_1$, $P_2$ and $P_3$.

Figure 6:
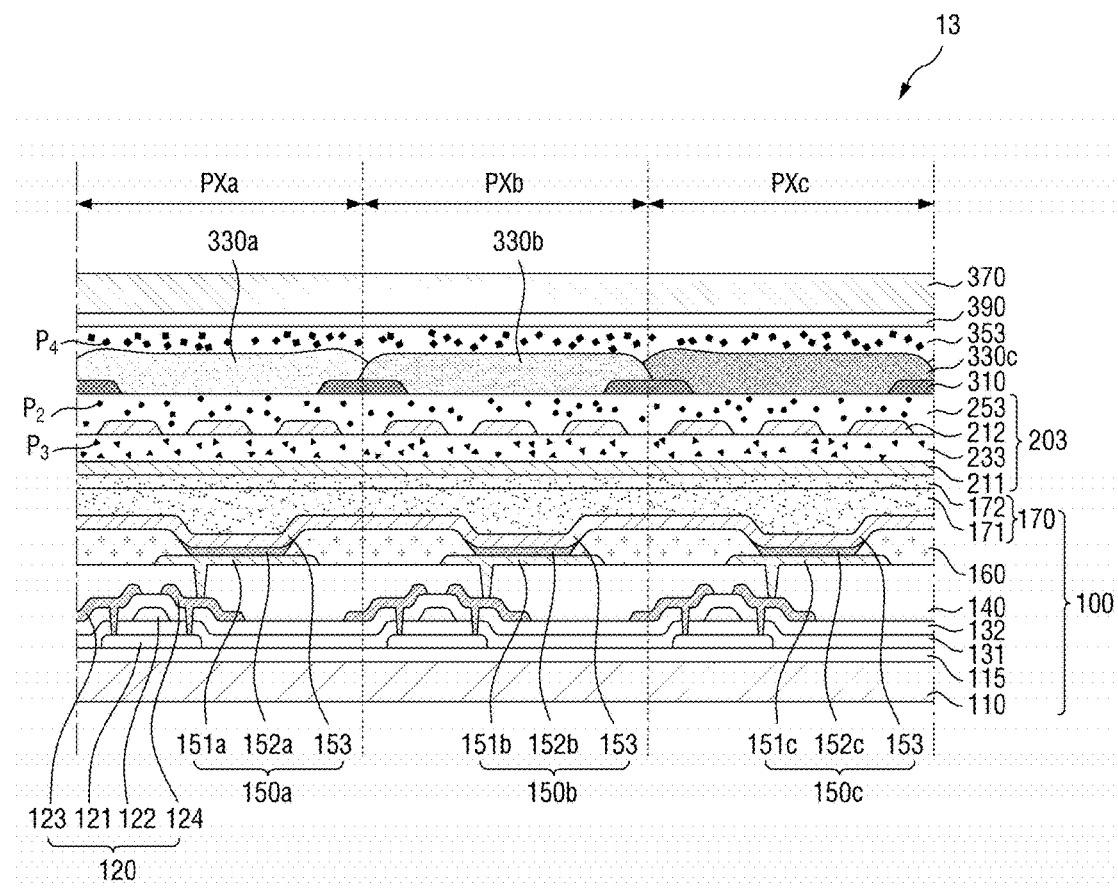

FIG. 6 is a cross-sectional view of a display device according to another alternative embodiment of the invention.

The display device 13 shown in FIG. 6 is substantially the same as the display device 12 shown in FIG. 5 except that the overcoat layer 353 of the display device 13 includes a fourth pigment $P_4$ or dye exhibiting a different color from the second pigment $P_2$ and the third pigment $P_4$ instead of a black pigment or a gray pigment.

In one embodiment, for example, the color exhibited by the second pigment $P_2$, the color exhibited by the third pigment $P_3$, and the color exhibited by the fourth pigment $P_4$ may be mixed with each other to exhibit black or gray. In one embodiment, for example, the second pigment $P_2$ may be a green pigment, the third pigment $P_3$ may be a blue pigment, and the fourth pigment $P_4$ may be a red pigment. The light sequentially passing through the third insulating layer 233, the fourth insulating layer 253 of a touch unit 203 and the overcoat layer 353 may be at least partially absorbed by the pigments in the respective layers without substantial color change.

In another alternative embodiment, types of the pigments included in the third insulating layer 233, the fourth insulating layer 252 and the overcoat layer 353 may be variously changed.

Hereinafter, an embodiment of a method of manufacturing a display device according to the invention will be described with reference to FIGS. 7 to 19.

FIGS. 7 to 19 are cross-sectional views showing a method of manufacturing a display device according to an embodiment of the invention in a stepwise manner.

Figure 7:
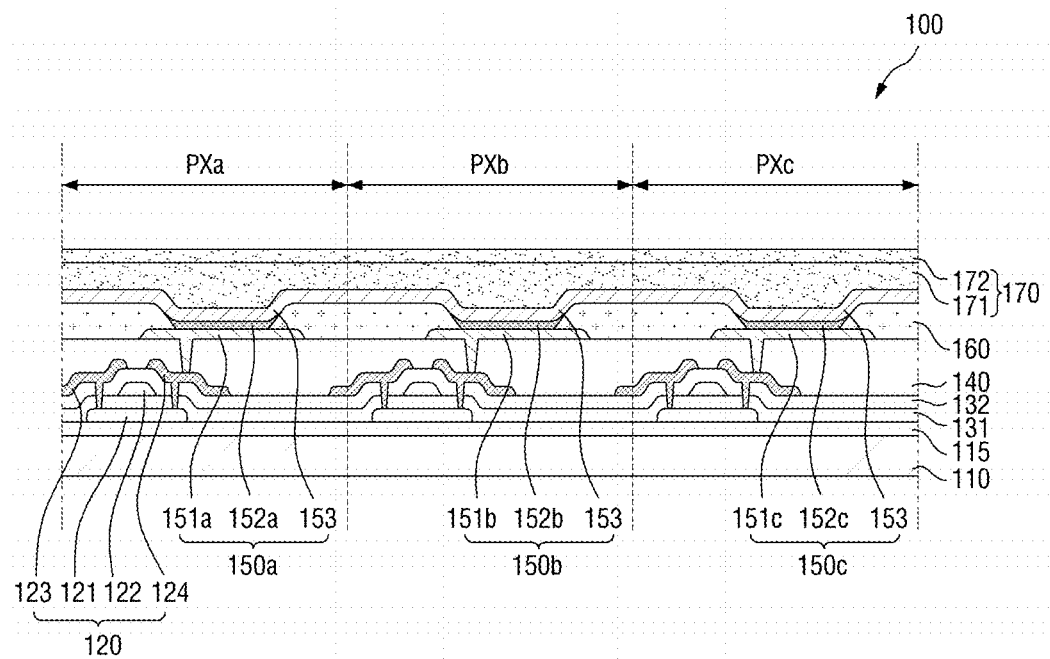
FIGS. 7 to 19 are cross-sectional views showing a method of manufacturing a display device according to an embodiment of the invention.

First, referring to FIG. 7, a display panel 100 is prepared. The display panel 100 includes a base substrate 110, one or more light-emitting elements 150a, 150b and 150c disposed on one side of the base substrate 110, thin film transistors 120 providing driving signals for driving the light-emitting elements 150a, 150b and 150c, and an encapsulation layer 170 disposed to seal the light-emitting elements 150a, 150b and 150c.

A plurality of pixels PXa, PXb, and PXc may be defined in the display panel 100. In an exemplary embodiment, the first pixel PXa may be a red pixel, the second pixel PXb may be a green pixel, and the third pixel PXc may be a blue pixel. The first light-emitting element 150a may be an organic light-emitting element disposed in the first pixel PXa to emit red light, the second light-emitting element 150b may be an organic light-emitting element disposed in the second pixel PXb to emit green light, and the third light-emitting element 150c may be an organic light-emitting element disposed in the third pixel PXc to emit blue light.

The display panel 100 may be substantially the same as the display panel shown in FIG. 1. The components of the display panel 100 have been described above in detail with reference to FIG. 1 and the like, and thus any repetitive detailed description thereof will be omitted.

Figure 8:
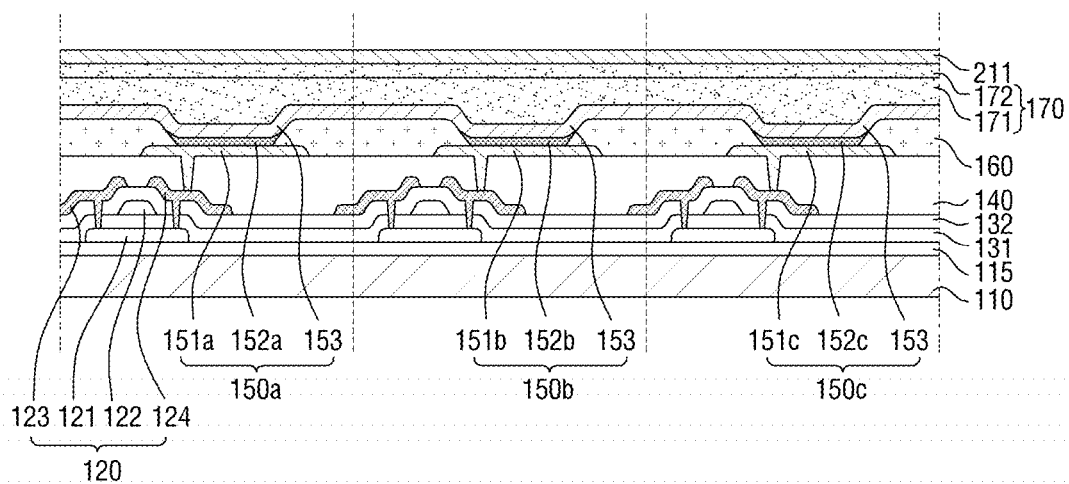

Subsequently, referring to FIGS. 7 and 8, a first pattern electrode 211 is provided or formed on the display panel 100. The first pattern electrode 211 may extend in the first direction (horizontal direction in the drawing) and may be spaced in the second direction intersecting the first direction, and the first pattern electrode 211 may be provided in plural. The first pattern electrode 211 may be a touch electrode. The method of forming the first pattern electrode 211 is not particularly limited. In one embodiment, for example, the first pattern electrode 211 may be formed by depositing a metal layer for forming the first pattern electrode 211 on the encapsulation layer 170 of the display panel 100 and then patterning the metal layer.

Figure 9:
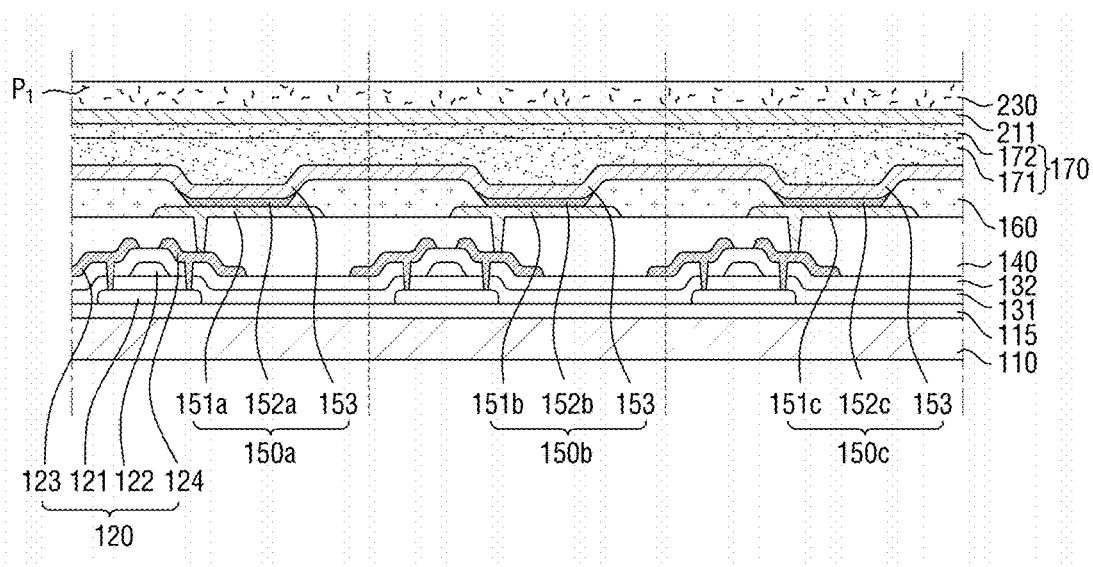

Subsequently, referring to FIGS. 8 and 9, a third insulating layer 230 is provided or formed on the first pattern electrode 211. The third insulating layer 230 may be an organic insulating layer including an organic material, such as an acrylic resin, an epoxy resin or a polyimide resin. The third insulating layer 230 may include a pigment $P_1$ dispersed in the organic material. In one embodiment, for example, the pigment $P_1$ may be a black pigment such as carbon black, or a gray pigment. In an embodiment, the pigment $P_1$ in the third insulating layer 230 exists in the form of particles, and the pigment $P_1$ may have an average particle size of, for example, about 50 nm to about 200 nm, but not being limited thereto.

The third insulating layer 230 may be integrally formed over the plurality of pixels PXa, PXb and PXc as a single unitary and indivisible unit. The method of forming the third insulating layer 230 is not particularly limited. In one embodiment, for example, the third insulating layer 230 may be formed by applying a composition for forming the third insulating layer 230 on the first patterned electrode 211 and curing the composition.

Figure 10:
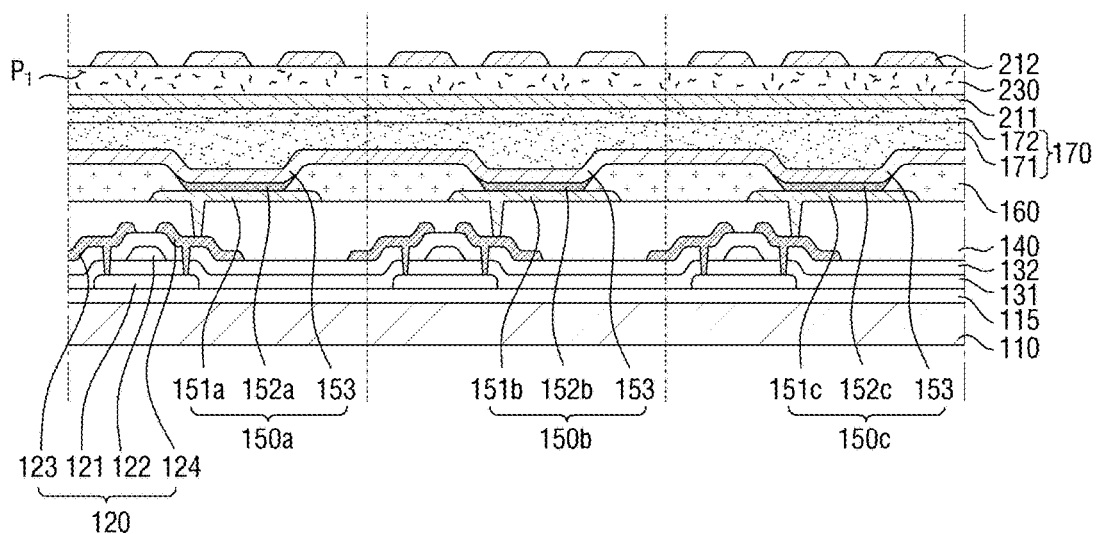

Subsequently, referring to FIGS. 9 and 10, a second pattern electrode 212 is provided or formed on the third insulating layer 230. The second pattern electrode 212 may extend in the second direction and may be spaced in the first direction (horizontal direction in the drawing), and the second pattern electrode 211 may be provided in plural. The second pattern electrode 212 may be a touch electrode. The method of forming the second pattern electrode 212 is not particularly limited. In one embodiment, for example, the second pattern electrode 212 may be formed by depositing a metal layer for forming the second pattern electrode 212 on the third insulating layer 230 and then patterning the metal layer.

Figure 11:
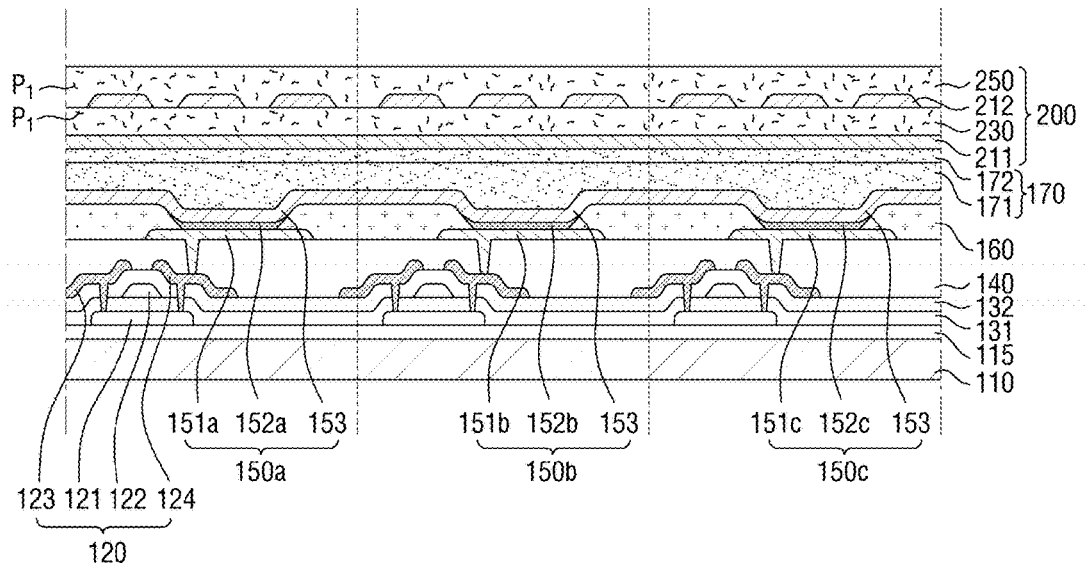

Subsequently, referring to FIGS. 10 and 11, a fourth insulating layer 250 is provided or formed on the second pattern electrode 212, e.g., on the third insulating layer 230 to cover the second pattern electrode 212. The fourth insulating layer 250 may be an organic insulating layer including an organic material, such as an acrylic resin, an epoxy resin or a polyimide resin. The fourth insulating layer 250 may include a pigment $P_1$ dispersed in the organic material. In one embodiment, for example, the pigment $P_1$ may be a black pigment or a gray pigment. In an embodiment, the pigment $P_1$ in the fourth insulating layer 250 exists in the form of particles, and the pigment $P_1$ may have an average particle size of, for example, about 50 nm to about 200 nm, but not being limited thereto.

The fourth insulating layer 250 may be integrally formed over the plurality of pixels PXa, PXb, and PXc as a single unitary and indivisible unit. The method of forming the fourth insulating layer 250 is not particularly limited. In one embodiment, for example, the fourth insulating layer 250 may be formed by applying a composition for forming the fourth insulating layer 250 on the second patterned electrode 212 and curing the composition.

Figure 12:
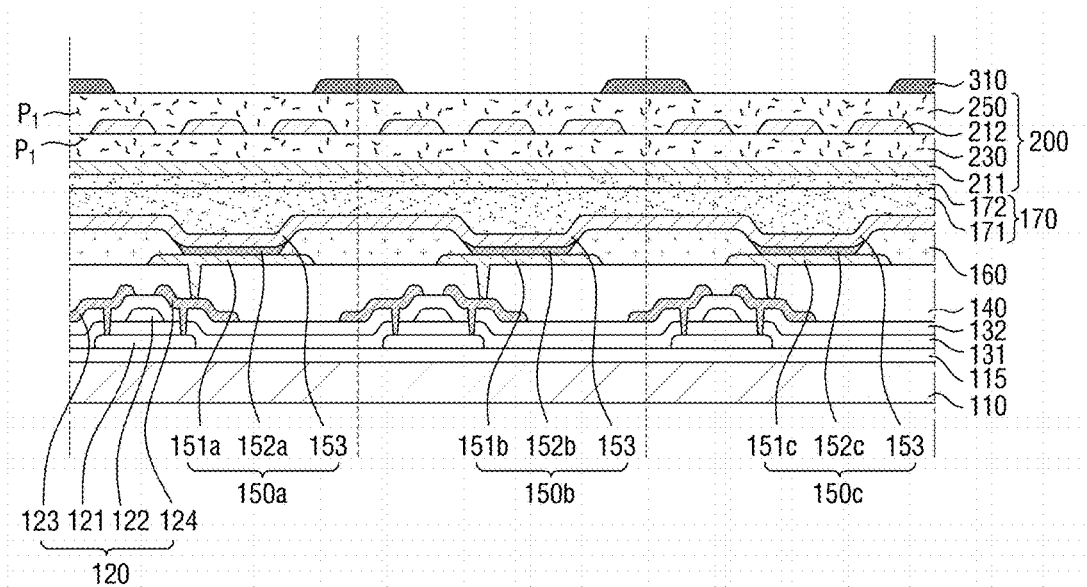

Subsequently, referring to FIGS. 11 and 12, a light-blocking member 310 is provided or formed on the fourth insulating layer 250. The light-blocking member 310 may be, for example, a black matrix. The light-blocking member 310 may be disposed at the boundary of each of the pixels PXa, PXb and PXc.

Figure 13:
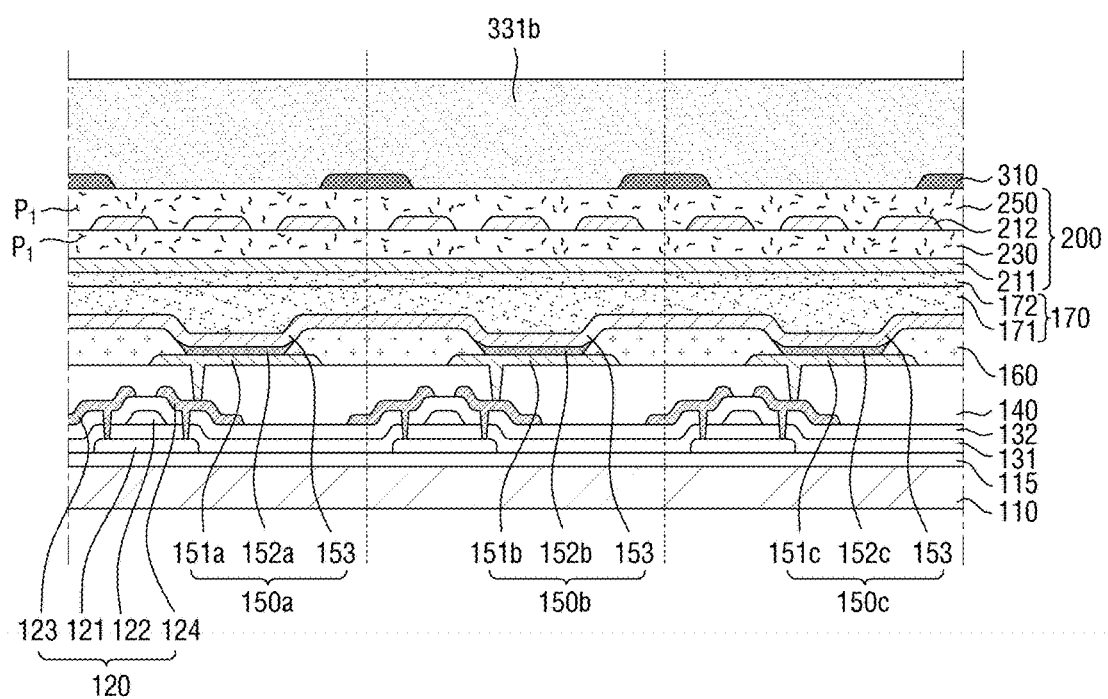

Subsequently, referring to FIGS. 12 and 13, a color filter composition 331b is applied onto the light-blocking member 310. The color filter composition 331b may be a photosensitive composition including a solvent and solid matter. The content of the solid matter may be about 20 wt % based on the total weight of the color filter composition 331b. In an exemplary embodiment, the color filter composition 331b may include a curable monomer, an initiator, a pigment and other additives. The curable monomer may include an acrylic monomer and/or an epoxy monomer. The other additives may include a catalyst, a silicon-based compound and/or a fluorine-based compound.

In an exemplary embodiment, where the color filter composition 331b is a composition for forming a green color filter, the pigment may be a green pigment. The content of the pigment may be in a range of about 25 wt % to about 30 wt % based on the total weight of the solid matter. In such an embodiment, the content of the pigment may be in a range of about 5 wt % to about 6 wt % based on the total weight of the color filter composition 331b. When the content of the pigment is about 5 wt % or more, the pigment can function as a color filter with sufficient transmission selectivity for light of a specific wavelength band. When the content of the pigment is about 6 wt % or less, the color filter can be easily cured in spite of performing a baking process at a relatively low temperature, which will be described later, thereby improving processability and realizing a patterned color filter having a regular taper shape.

Figure 14:
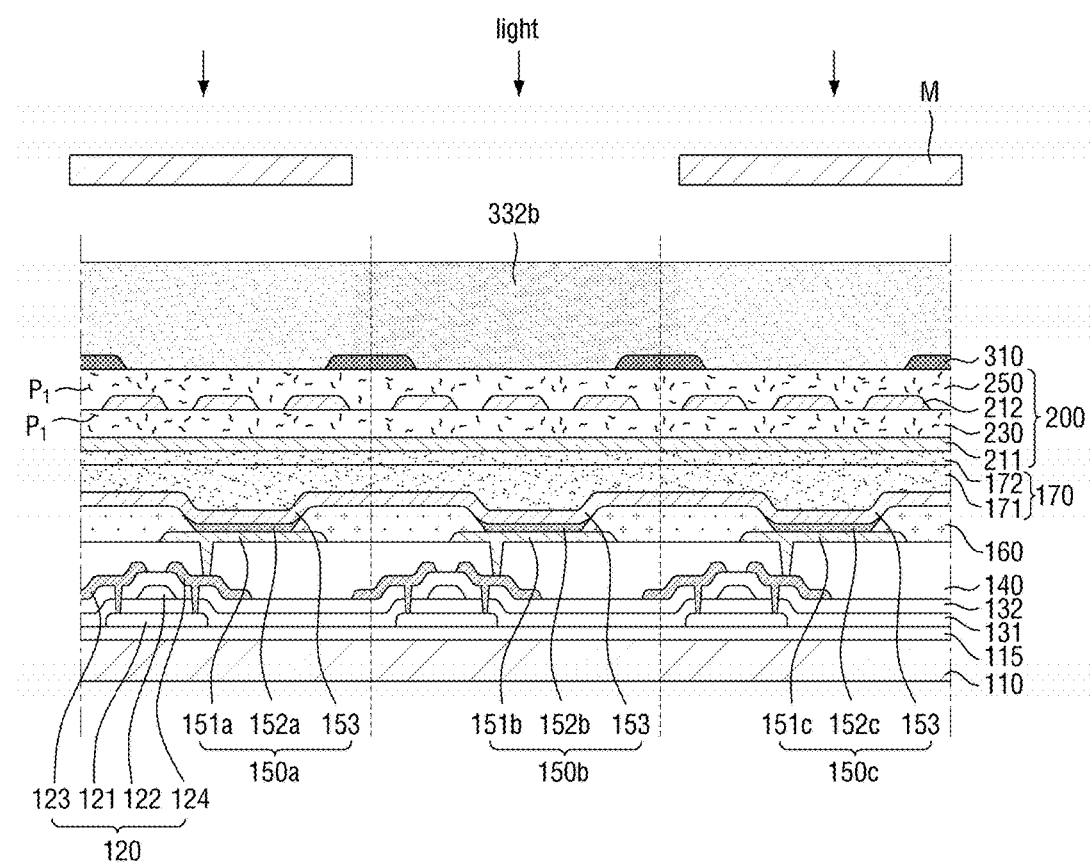

Subsequently, referring to FIGS. 13 and 14, a mask M is disposed over the color filter composition 331b, and then the color filter is irradiated with light, to form a partially cured color filter 332b. An opening is defined in the mask M, and light may be selectively transmitted through the opening. In an exemplary embodiment where the color filter composition 331b is a composition for forming a green color filter, the mask M is disposed in a way such that the opening of the mask M overlaps the second pixel PXb.

In an exemplary embodiment, where the color filter composition 331b is a negative type photosensitive composition in which the curing of a polymer is induced from the exposed portion, the color filter composition 331b overlapping the opening of the mask M is at least partially cured to form a partially cured color filter 332b. In such an embodiment, the color filter composition 331b light-blocked by the mask M may not be cured. In one embodiment, for example, the upper portion of the partially cured color filter 332b that is primarily exposed may have a greater degree of curing than the lower portion thereof. In one embodiment, for example, the partially cured color filter 332b may have a lower degree of curing from the upper portion thereof to the lower portion thereof.

Figure 15:
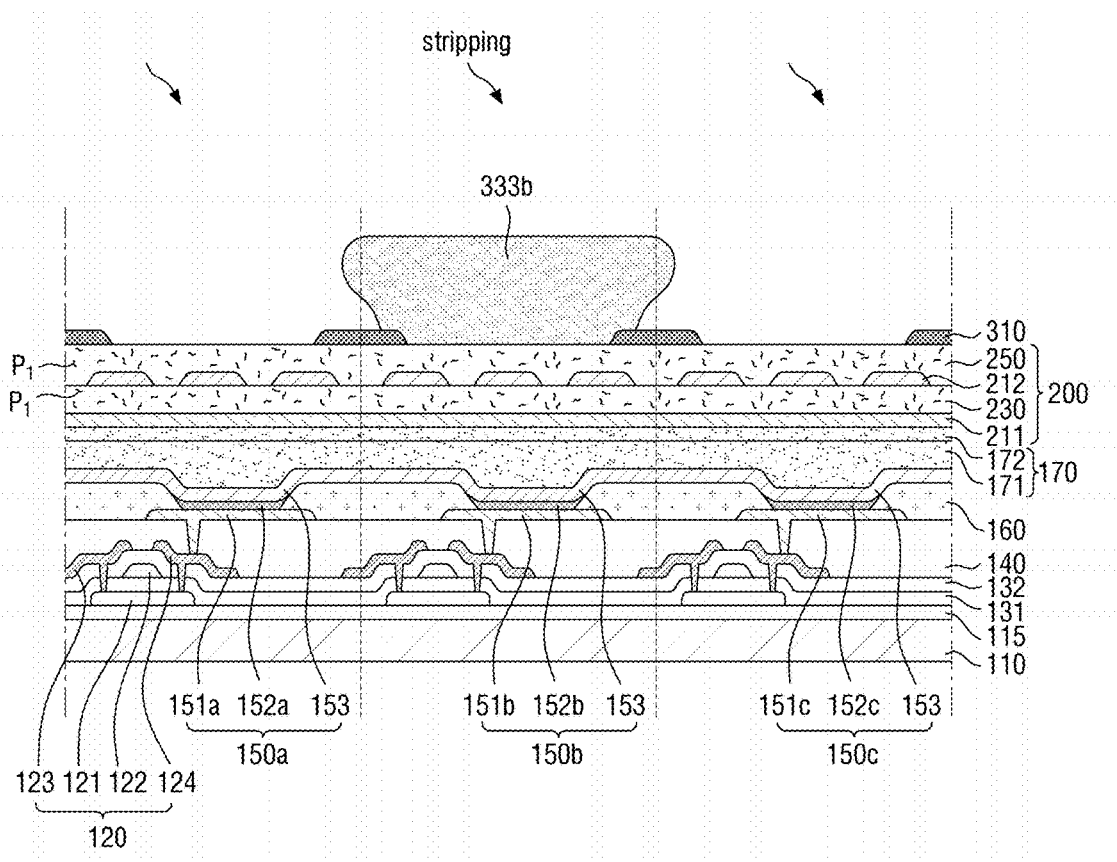

Subsequently, referring to FIGS. 14 and 15, the uncured portion of the partially cured color filter 332b is removed using a stripper to form a developed pre-color filter 333b. In such an embodiment, the uncured portion of the partially cured color filter 332b may be removed by the stripper, and the cured portion thereof may remain to form the developed pre-color filter 333b.

In one embodiment, for example, the stripper may penetrate into the partially cured color filter 332b through the sidewalls of the cured portion of the partially cured color filter 332b to at least partially remove the portion that is relatively slightly cured, so that the developed pre-color filter 333b has an approximately reverse taper shape. In one embodiment, for example, the planar area of the exposed upper surface of the developed pre-color filter 333b may be greater than the planar area of the lower surface of the developed pre-color filter 333b, the lower surface facing the touch unit 200, and the side walls of the developed pre-color filter 333b may have a reverse inclination.

Figure 16:
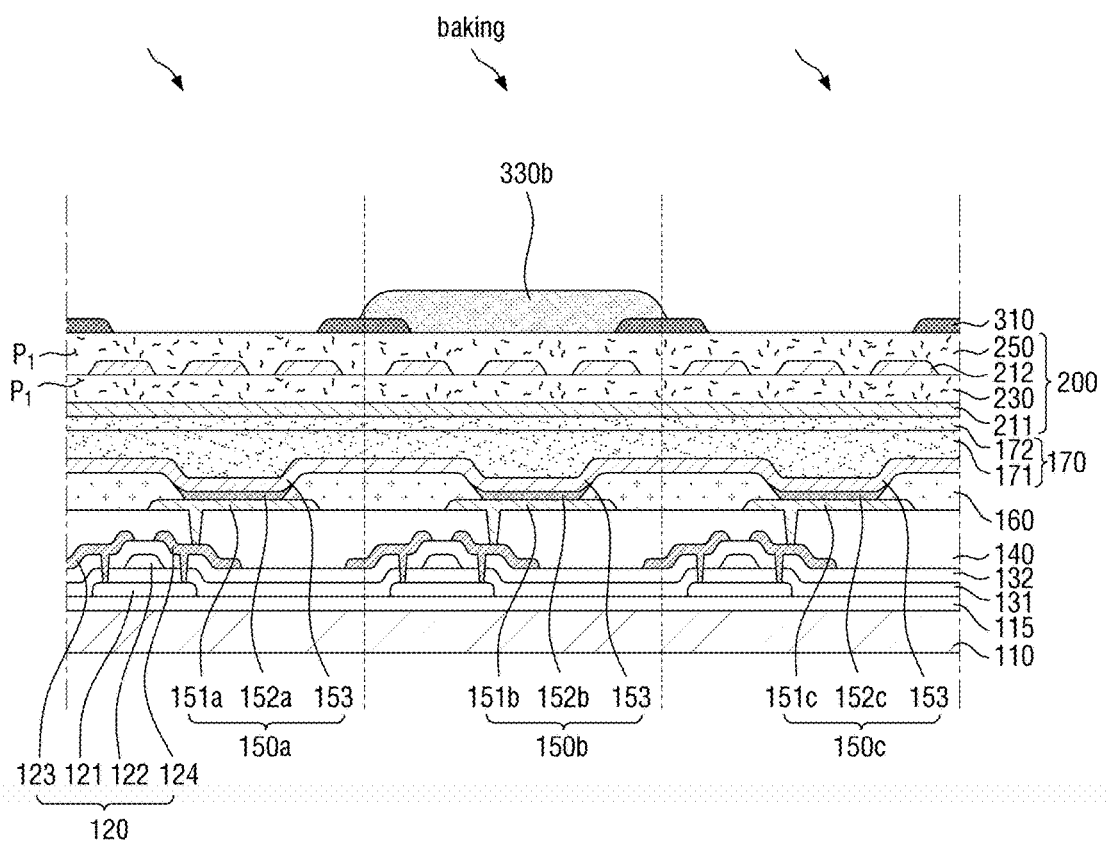

Subsequently, referring to FIGS. 15 and 16, the developed pre-color filter 333b is baked to form a patterned color filter 330b. In an exemplary embodiment, baking temperature may be about 120° C. or lower. The components in the display panel, such as the organic light-emitting layers 152a, 152b and 152c, may not be damaged by performing the baking process at a relatively low temperature, e.g., at about 120° C. or lower.

In an exemplary embodiment, the pre-color filter 333b developed through the baking process may at least partially undergo shape deformation. In one embodiment, for example, the sidewalls of the developed pre-color filter 333b having a reverse taper shape may be deformed to form the patterned color filter 330b having a regular taper shape. In one embodiment, for example, the planar area of the exposed upper surface of the patterned color filter 330b may be smaller than the planar area of the lower surface of the patterned color filter 330b, the lower surface facing the touch unit 200, and the side walls of the patterned color filter 330b may have an inclination.

As described above, in an embodiment, the content of the pigment in the color filter composition is set in the range of about 5 wt % to about 6 wt %, such that the sufficiently cured patterned color filter 330b may be formed in spite of performing the baking process at a relatively low temperature, thereby improving processability and forming the patterned color filter 330b having a regular taper shape.

Figure 17:
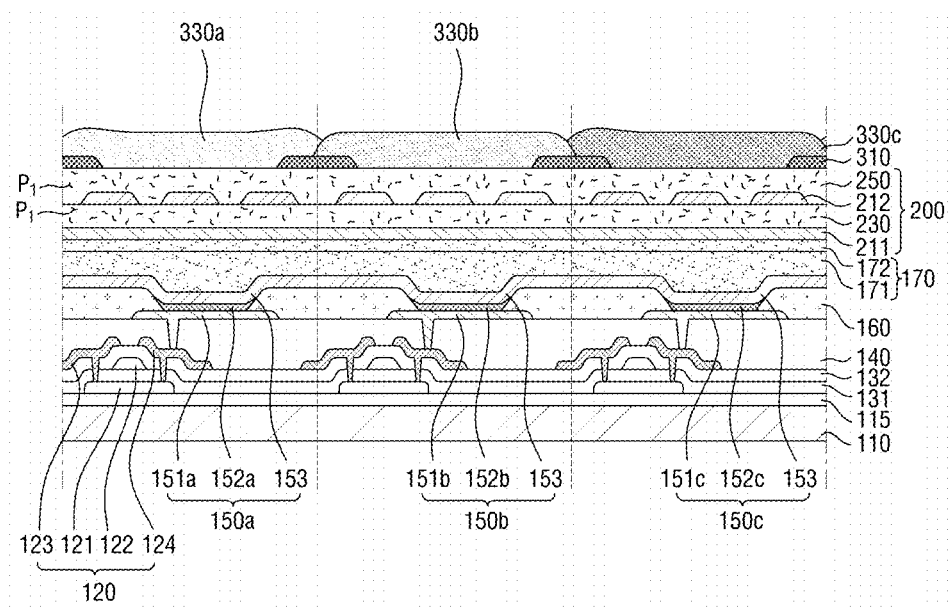

Subsequently, referring to FIGS. 16 and 17, a patterned color filter 330a in the first pixel PXa and a patterned color filter 330c in the third pixel PXc are formed. The patterned color filter 330a in the first pixel PXa and the patterned color filter 330c in the third pixel PXc may all have a regular taper shape. The method of forming the patterned color filter layer 330a and 330c in the first and third pixels PXa and PXc may be substantially the same as the method of forming the patterned color filter 330b in the second pixel PXb, and thus any repetitive detailed description thereof will be omitted.

Subsequently, referring to FIGS. 7 to 18, an overcoat layer 350 is provided or formed on the patterned color filter layer 330a, 330b and 330c. The overcoat layer 350 may be in direct contact with the patterned color filter layer 330a, 330b and 330c. The overcoat layer 350 may be an organic layer including an organic material, such as an acrylic resin, an epoxy resin or a polyimide resin. The overcoat layer 350 may include a pigment $P_1$ dispersed in the organic material. In one embodiment, for example, the pigment $P_1$ may be a black pigment or a gray pigment. In an embodiment, where the pigment $P_1$ in the overcoat layer 350 exists in the form of particles, and the pigment $P_1$ may have an average particle size of, for example, about 50 nm to about 200 nm, but not being limited thereto.

The overcoat layer 350 may be integrally formed over the plurality of pixels PXa, PXb, and PXc as a single unitary and indivisible unit. The method of forming the overcoat layer 350 is not particularly limited. In one embodiment, for example, the overcoat layer 350 may be formed by applying a composition for forming the overcoat layer 350 on the patterned color filter layer 330a, 330b and 330c and curing the composition.

Figure 18:
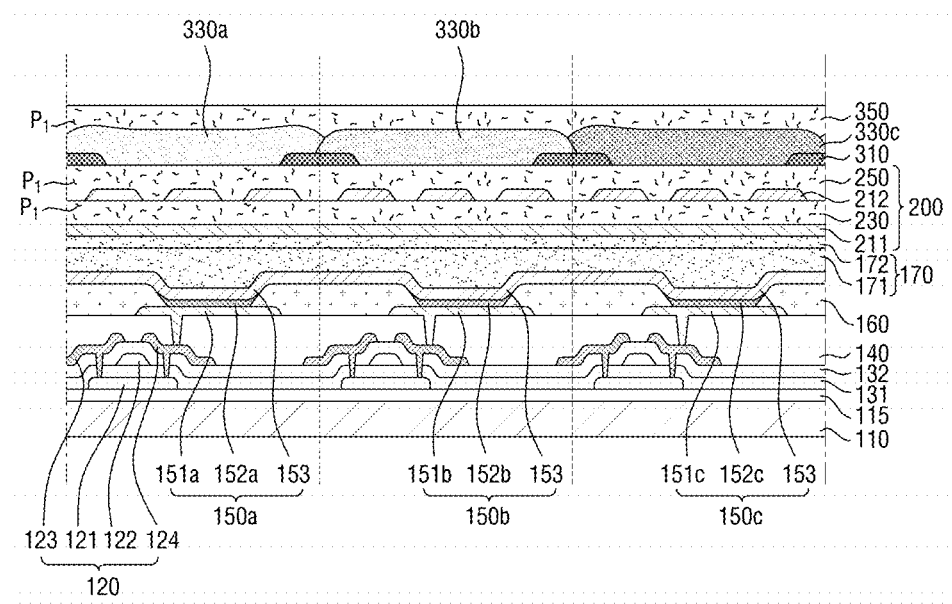
Figure 19:
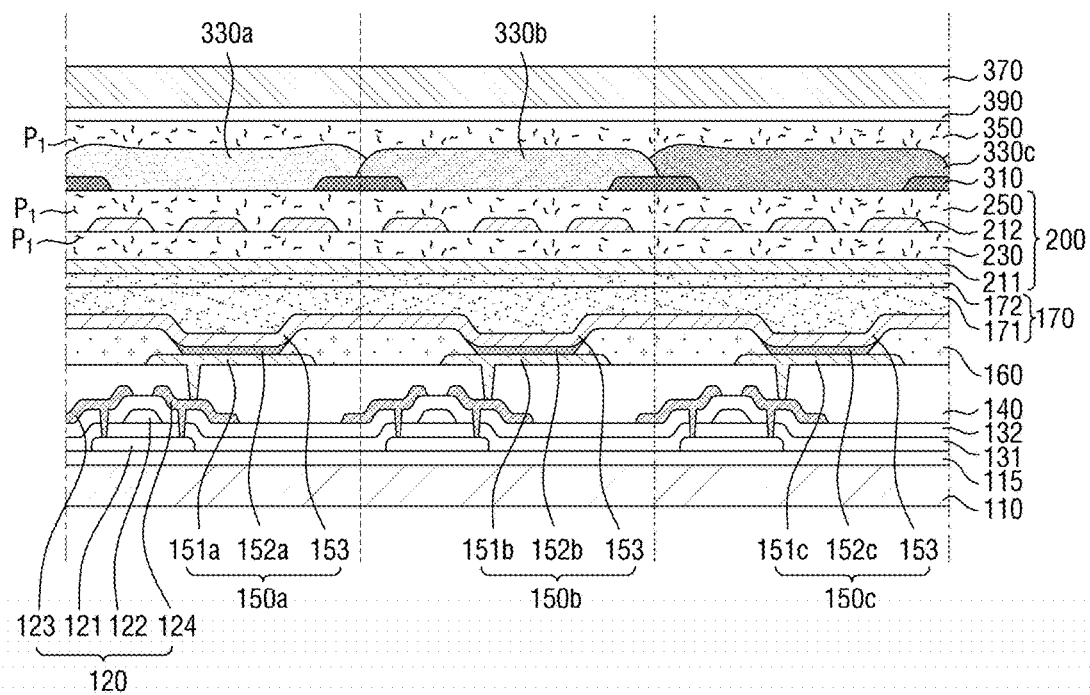

Subsequently, referring to FIGS. 18 and 19, a window 370 is provided or disposed on the overcoat layer 350 with an adhesive layer 390 interposed therebetween. The adhesive layer 390 may be in direct contact with the overcoat layer 350 and the window 370 to attach the overcoat layer 350 and the window 370.

As described above, according to embodiments of the display device, color purity may be improved to improve display quality, the reflection of external light may be suppressed to improve outdoor visibility, and the utilization efficiency of light emitted by a light-emitting element may be maximized to improve luminance and reduce power consumption.

According to an embodiment of a method of manufacturing a display device, a display device which improves color purity to improve display quality and suppress the reflection of external light to improve outdoor visibility may be manufactured. In such an embodiment, a display device which maximizes the utilization efficiency of light emitted by a light-emitting element to improve luminance and reduce power consumption may be manufactured.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A display device, in which a first pixel and a second pixel are defined, the display device comprising:
    a display panel comprising:
        a base substrate; and
        a light-emitting element disposed on the base substrate;
    a color filter layer disposed over the display panel, wherein the color filter layer comprises a first color filter disposed in the first pixel and a second color filter disposed in the second pixel; and
    a plurality of organic layers disposed over the display panel, wherein a plurality of pigments or dyes exhibiting different colors from each other is disposed in each of the plurality of organic layers,
    wherein the first pixel displays a first color, and the second pixel displays a second color different from the first color, and
    wherein the plurality of organic layers comprises a first organic layer integrally formed over the first pixel and the second pixel.

2. The display device of claim 1, wherein
the display panel further comprises a encapsulation layer disposed on the light-emitting element, and
the display device further comprises:
    a first pattern electrode disposed between the encapsulation layer and the color filter layer and extending in a first direction; and
    a second pattern electrode disposed between the first pattern electrode and the color filter layer, and extending in a second direction intersecting the first direction,
    wherein the first organic layer is disposed between the first pattern electrode and the second pattern electrode in a way such that the first pattern electrode and the second pattern electrode are insulated from each other by the first organic layer.

3. The display device of claim 2, wherein
the first organic layer comprises an acrylic resin, an epoxy resin or a polyimide resin.

4. The display device of claim 2, wherein the plurality of organic layers further comprises:
    a second organic layer disposed between the second pattern electrode and the color filter layer,
    wherein
    the second organic layer is integrally formed over the first pixel and the second pixel, and
    the second organic layer is at least partially in direct contact with the first organic layer.

5. The display device of claim 1, wherein
the first organic layer is disposed on the color filter layer, and
the display device further comprises:
    an adhesive layer disposed on the first organic layer; and
    a window disposed on the adhesive layer.

6. The display device of claim 1, wherein the plurality of organic layers further comprises:
    a second organic layer disposed over the display panel, wherein the second organic layer is integrally formed over the first pixel and the second pixel,
    wherein a color exhibited by a pigment or dye in the first organic layer and a color exhibited by a pigment or dye in the second organic layer are complementary to each other.

7. The display device of claim 1, wherein the light-emitting element comprises:
    a first light-emitting element disposed in the first pixel, wherein the first light-emitting element emits first light having a single peak wavelength; and
    a second light-emitting element disposed in the second pixel, wherein the second light-emitting element emits second light exhibiting a different color from the first light and having a single peak wavelength.

8. The display device of claim 7, wherein
the first color filter comprises a resin and a pigment dispersed in the resin, and
the content of the pigment in the first color filter is in a range of about 25 wt % to about 30 wt % based on the total weight of the first color filter.

9. The display device of claim 8,
wherein the first color filter has a regular taper shape.

10. The display device of claim 9, wherein
the first color filter further comprises a silicon-based compound or a fluorine-based compound.

11. The display device of claim 1, wherein
a pigment in the first organic layer exist in the form of particles, and
the pigment in the first organic layer comprises a black pigment or the plurality of pigments exhibiting different colors from each other.

12. The display device of claim 11, wherein
an average particle size of the pigment in the first organic layer is in a range of about 50 nm to about 200 nm.

13. The display device of claim 12, further comprising:
    a window disposed on the first organic layer and the color filter layer,
    wherein an amount of external light passed through the window and reaching the display panel is in a range of about 50% to about 70% of the total amount of the external light.

14. The display device of claim 13, wherein
the light-emitting element comprises:
    a first light-emitting element disposed in the first pixel, wherein the first light-emitting element emits first light having a single peak wavelength; and
    a second light-emitting element disposed in the second pixel, wherein the second light-emitting element emits second light having a single peak wavelength less than the peak wavelength of the first light, and
a ratio of an amount of the first light emitted from the first light-emitting element and passing through the window to an amount of the first light emitted from the first light-emitting element is less than a ratio of an amount of the second light emitted from the second light-emitting element and passing through the window to an amount of the second light emitted from the second light-emitting element.

15. The display device of claim 12, further comprising:
    a window disposed on the first organic layer and the color filter layer,
    wherein the external light passed through the window and traveling toward the light-emitting element is in an unpolarized state.

16. A display device, in which a first pixel and a second pixel are defined, the display device comprising:
a display panel comprising:
a base substrate; and
a light-emitting element disposed on the base substrate;
a color filter layer disposed over the display panel, wherein the color filter layer comprises a first color filter disposed in the first pixel and a second color filter disposed in the second pixel; and
a plurality of organic layers disposed over the display panel, wherein a color of a pigment or dye in one of the plurality of organic layers is different from a color of pigment or dye in another one of the plurality of organic layers,
wherein the first pixel displays a first color, and the second pixel displays a second color different from the first color, and
wherein the plurality of organic layers comprises a first organic layer integrally formed over the first pixel and the second pixel.

17. The display device of claim 16, wherein
the display panel further comprises a encapsulation layer disposed on the light-emitting element, and
the display device further comprises:
a first pattern electrode disposed between the encapsulation layer and the color filter layer and extending in a first direction; and
a second pattern electrode disposed between the first pattern electrode and the color filter layer, and extending in a second direction intersecting the first direction,
wherein the first organic layer is disposed between the first pattern electrode and the second pattern electrode in a way such that the first pattern electrode and the second pattern electrode are insulated from each other by the first organic layer.

18. The display device of claim 17, wherein the plurality of organic layers further comprises:
a second organic layer disposed between the second pattern electrode and the color filter layer,
wherein
the second organic layer is integrally formed over the first pixel and the second pixel, and
the second organic layer is at least partially in direct contact with the first organic layer.

19. The display device of claim 16, wherein the plurality of organic layers further comprises:
a second organic layer disposed over the display panel, wherein the second organic layer is integrally formed over the first pixel and the second pixel,
wherein a color exhibited by a pigment or dye in the first organic layer and a color exhibited by a pigment or dye in the second organic layer are complementary to each other.

20. The display device of claim 16, wherein the light-emitting element comprises:
a first light-emitting element disposed in the first pixel, wherein the first light-emitting element emits first light having a single peak wavelength; and
a second light-emitting element disposed in the second pixel, wherein the second light-emitting element emits second light exhibiting a different color from the first light and having a single peak wavelength.

* * * * *